(12) United States Patent
Mao

(10) Patent No.: US 10,389,308 B2
(45) Date of Patent: Aug. 20, 2019

(54) ENVELOPE TRACKING FRONTEND DEVICE AND SWITCH THEREOF

(71) Applicant: PSJ INTERNATIONAL LTD., Tortola (VG)

(72) Inventor: Shau-Gang Mao, Taipei (TW)

(73) Assignee: PSJ INTERNATIONAL LTD., Tortola (VG)

( * ) Notice: Subject to any disclaimer, the term of this patent is extended or adjusted under 35 U.S.C. 154(b) by 0 days.

(21) Appl. No.: 15/897,735

(22) Filed: Feb. 15, 2018

(65) Prior Publication Data

US 2019/0006996 A1 Jan. 3, 2019

(30) Foreign Application Priority Data

Jun. 28, 2017 (TW) .............................. 106209418 U

(51) Int. Cl.

| H03G 3/20 | (2006.01) |
|---|---|
| H03F 1/02 | (2006.01) |
| H03F 3/19 | (2006.01) |
| H03F 3/21 | (2006.01) |
| H03F 1/32 | (2006.01) |
| H03F 1/56 | (2006.01) |
| H03F 3/24 | (2006.01) |
| H04B 1/44 | (2006.01) |

(52) U.S. Cl.
CPC ......... *H03F 1/0233* (2013.01); *H03F 1/0222* (2013.01); *H03F 1/32* (2013.01); *H03F 1/565* (2013.01); *H03F 3/19* (2013.01); *H03F 3/21* (2013.01); *H03F 3/245* (2013.01); *H03F 2200/105* (2013.01); *H03F 2200/129* (2013.01); *H03F 2200/222* (2013.01); *H03F 2200/318* (2013.01); *H03F 2200/387* (2013.01); *H03F 2200/451* (2013.01); *H04B 1/44* (2013.01)

(58) Field of Classification Search
CPC ...... H03F 1/0222; H03F 1/0227; H03F 1/025; H03F 3/72
USPC .............................................. 330/136; 455/78
See application file for complete search history.

(56) References Cited

U.S. PATENT DOCUMENTS

2015/0105033 A1* 4/2015 Modi .................... H03F 3/191
455/78

* cited by examiner

*Primary Examiner* — Steven J Mottola
(74) *Attorney, Agent, or Firm* — Li & Cai Intellectual Property (USA) Office

(57) ABSTRACT

An envelope tracking frontend device and a switch thereof are provided. The envelope tracking frontend device includes a power amplifier coupled, a switch and an envelope tracking module including an envelope tracking bias supply coupled between the signal generator and the switch. The switch includes a transmit-receive port, a transmit port coupled to the power amplifier, a receive port, a first terminal and a second terminal in series connection, and a third transistor and a fourth transistor as shunt transistors. The envelope tracking bias supply is configured to provide an envelope forward bias signal to the gate of the second transistor and the gate of the fourth transistor, and provide an envelope reverse bias signal to the gate of the first transistor and the gate of the third transistor such that an amplified signal is modulated before being provided by the switch.

17 Claims, 21 Drawing Sheets

ENVELOPE TRACKING FRONTEND DEVICE AND SWITCH THEREOF

BACKGROUND OF THE INVENTION

1. Field of the Invention

The present disclosure relates to a frontend device; in particular, to an envelope tracking frontend device and a switch thereof.

2. Description of Related Art

Efficiency and linearity of the radio frequency (RF) power amplifier are critical elements for wireless communication, especially when two or more component carriers of the same or different bandwidths are aggregated for concurrent multi-channel operation so as to meet increasing the demands for data transmission rate and transmission bandwidth.

Furthermore, in response to the next-generation wireless communication system using high peak-to-average-power ratio (PAPR), it is critical to develop multipower-mode operation and enhance characteristics such as high-isolation path selection, high efficiency and high linearity characteristics in the design of the RF frontend module.

With reference to Non Patent Citations 1-3 provided below, among conventional solutions, envelope tracking (ET) technique dynamically adjusting the supply voltage of the power amplifier in accordance with the envelope of the signal is often adopted to enhance both linearity and efficiency of the power amplifier. However, it is difficult for envelope tracking circuits in the prior art to operate with signals of wide bandwidths.

[Non Patent Citation 1] F. Wang, D. F. Kimball, D. Y. Lie, P. M. Asbeck, and L. E Larson, "A monolithic high-efficiency 2.4-GHz 20-dBm SiGe BiCMOS envelope-tracking OFDM power amplifier," IEEE J. Solid-State Circuits, VOL. 42, NO. 6, PP. 1271-1281, June 2007.

[Non Patent Citation 2] R. Wu, Y. T. Liu, J. Lopez, Y. Li, and D. Y. C. Lie, "High-efficiency silicon-based envelope-tracking power amplifier design with envelope shaping for broadband wireless applications," IEEE J. Solid-State Circuits, VOL. 48, NO. 9, PP. 2030-2040, September 2013.

[Non Patent Citation 3] D. Y. C. Lie et al., "Design of monolithic silicon-based envelope-tracking power amplifiers for broadband wireless applications," in Proc. IEEE Asia-Pacific Conf. Circuits Syst., December 2012, PP. 212-215.

SUMMARY OF THE INVENTION

Accordingly, one of the objectives of the present disclosure is to provide an envelope tracking frontend device and a switch thereof that achieves high efficiency and high linearity performances for wide-bandwidth carrier aggregation applications.

In order to achieve the above objectives, one embodiment of the present disclosure provides a switch of an envelope tracking frontend device. The switch includes a transmit-receive port coupled to a device, a transmit port coupled to a power amplifier of the envelope tracking frontend device, a receive port coupled to a receiver circuit, a first transistor, a second transistor, a third transistor and a fourth transistor. The first transistor includes a first terminal coupled to ground, a second terminal coupled to the transmit port, and a gate coupled to an envelope tracking bias supply. The second transistor includes a first terminal connected to the transmit port, a second terminal connected to the transmit-receive port, and a gate coupled to the envelope tracking bias supply. The third transistor includes a first terminal connected to the transmit-receive port, a second terminal coupled to the receive port, and a gate coupled to the envelope tracking bias supply. The fourth transistor includes a first terminal connected to the receive port, a second terminal coupled to ground, and a gate coupled to the envelope tracking bias supply. A first signal amplified by the power amplifier is transmitted via the transmit port to the switch as an amplified signal, which is configured to transmit the amplified signal to the device via the transmit-receive port in a first mode, and transmit a second signal from the device to the receiver circuit via the receive port in a second mode. In the first mode, the envelope tracking bias supply is configured to provide an envelope forward bias signal to the gate of the second transistor and the gate of the fourth transistor, and provide an envelope reverse bias signal to the gate of the first transistor and the gate of the third transistor such that the amplified signal is modulated before being transmitted to the device by the switch. In the second mode, the envelope tracking bias supply is configured to provide the envelope forward bias signal to the gate of the first transistor and the gate of the third transistor, and provide the envelope reverse bias signal to the gate of the second transistor and the gate of the fourth transistor such that the second signal is modulated before being transmitted to the receiver circuit by the switch.

Another embodiment of the present disclosure provides an envelope tracking frontend device, including a power amplifier, a switch, and an envelope tracking module. The power amplifier is coupled to a signal generator and configured to receive and amplify a first signal therefrom and output an amplified signal. The switch is coupled to a device and a receiver circuit and configured to transmit the amplified signal to the device in a first mode, and receive a second signal from the device to the receiver circuit in a second mode. The envelope tracking module includes an envelope tracking bias supply coupled between the signal generator and the switch. The switch includes a transmit-receive port coupled to the device, a transmit port coupled to a power amplifier, a receive port coupled to the receiver circuit, a first transistor, a second transistor, a third transistor and a fourth transistor. The first transistor includes a first terminal coupled to ground, a second terminal coupled to the transmit port, and a gate coupled to an envelope tracking bias supply. The second transistor includes a first terminal connected to the transmit port, a second terminal connected to the transmit-receive port, and a gate coupled to the envelope tracking bias supply. The third transistor includes a first terminal connected to the transmit-receive port, a second terminal coupled to the receive port, and a gate coupled to the envelope tracking bias supply. The fourth transistor includes a first terminal connected to the receive port, a second terminal coupled to ground, and a gate coupled to the envelope tracking bias supply. In the first mode, the envelope tracking bias supply is configured to provide an envelope forward bias signal to the gate of the second transistor and the gate of the fourth transistor, and provide an envelope reverse bias signal to the gate of the first transistor and the gate of the third transistor such that the amplified signal is modulated before being transmitted to the device by the switch. In the second mode, the envelope tracking bias supply is configured to provide the envelope forward bias signal to the gate of the first transistor and the gate of the third transistor, and provide the envelope reverse bias signal to the gate of the second transistor and the gate of the fourth transistor such that the second signal is modulated before being transmitted to the receiver circuit by the switch.

In summary, the present disclosure is advantageous in that the envelope tracking frontend device and the switch thereof can achieve "the amplified signal is modulated before being transmitted to the device by the switch" and "the second signal is modulated before being transmitted to the receiver circuit by the switch" with the technical feature of "the envelope tracking bias supply is configured to provide an envelope forward bias signal to the gate of the second transistor and the gate of the fourth transistor, and provide an envelope reverse bias signal to the gate of the first transistor and the gate of the third transistor."

In order to further the understanding of the present disclosure, reference is made to the following detailed description illustrating the embodiments and examples of the present disclosure. The description is for illustrative purpose only and is not intended to limit the scope of the claim.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

The First Embodiment

Figure 1:
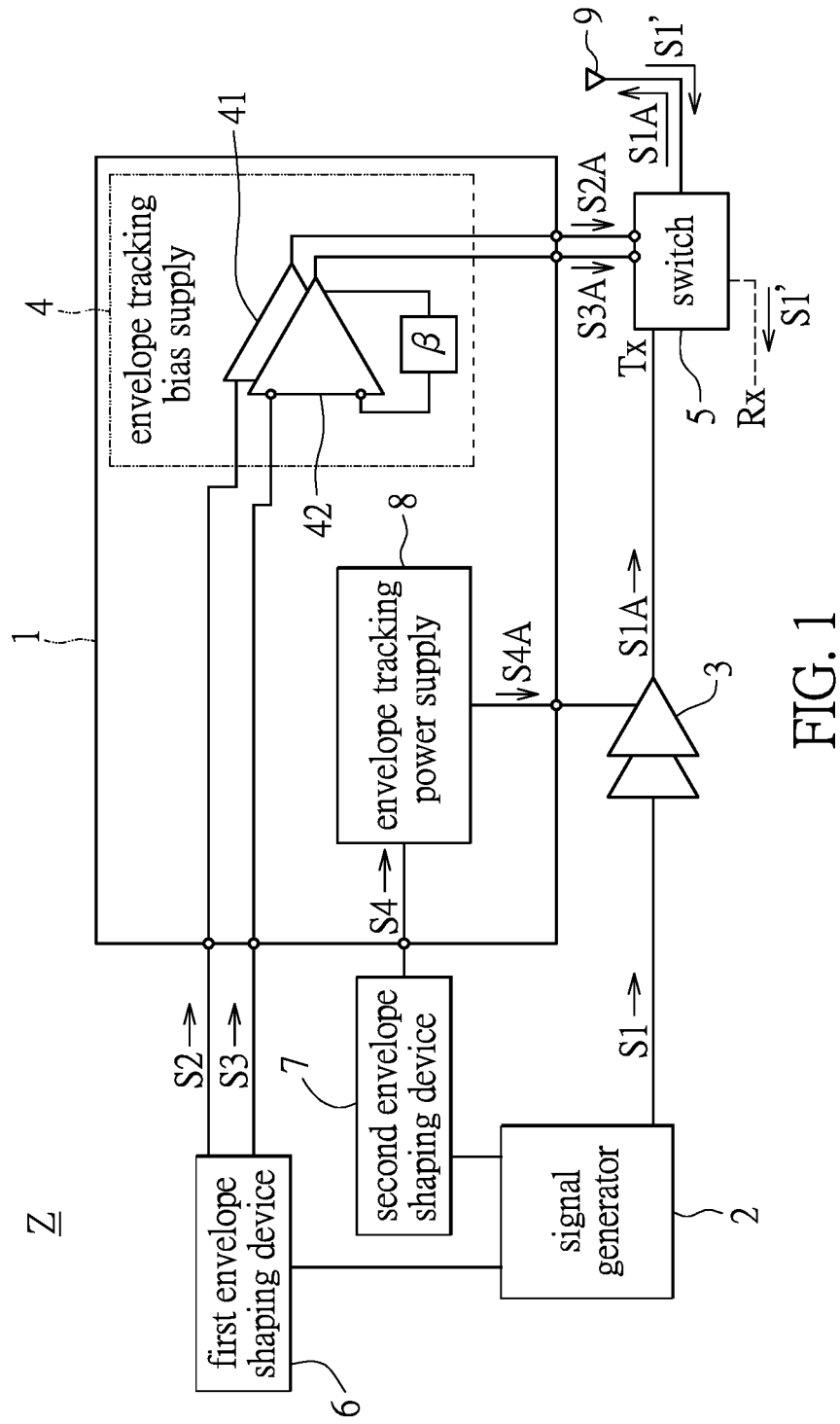
FIG. 1 is a functional block diagram illustrating an envelope tracking frontend device according to a first embodiment of the present disclosure.

Reference is made to FIG. 1. The present disclosure provides an envelope tracking frontend device Z including an envelope tracking module 1, a power amplifier 3 coupled to a signal generator 2, and a switch 5. The power amplifier 3 is configured to receive and amplify a first signal S1 from the signal generator 2 and provide an amplified signal S1A. The switch 5 is coupled to a device, which is an antenna 9 in the present embodiment, and is configured to transmit the amplified signal S1A to the antenna 9 in a first mode. Moreover, the switch 5 is further coupled to a receiver circuit (not shown in the drawings), and is configured to transmit a second signal S1' from the antenna 9 to the receiver circuit in a second mode. The envelope tracking module 1 includes an envelope tracking bias supply 4 coupled between the signal generator 2 and the switch 5. In the present embodiment, the signal generator 2 is a carrier aggregation signal generator and the first signal S1 is a carrier aggregation signal.

Figure 2:
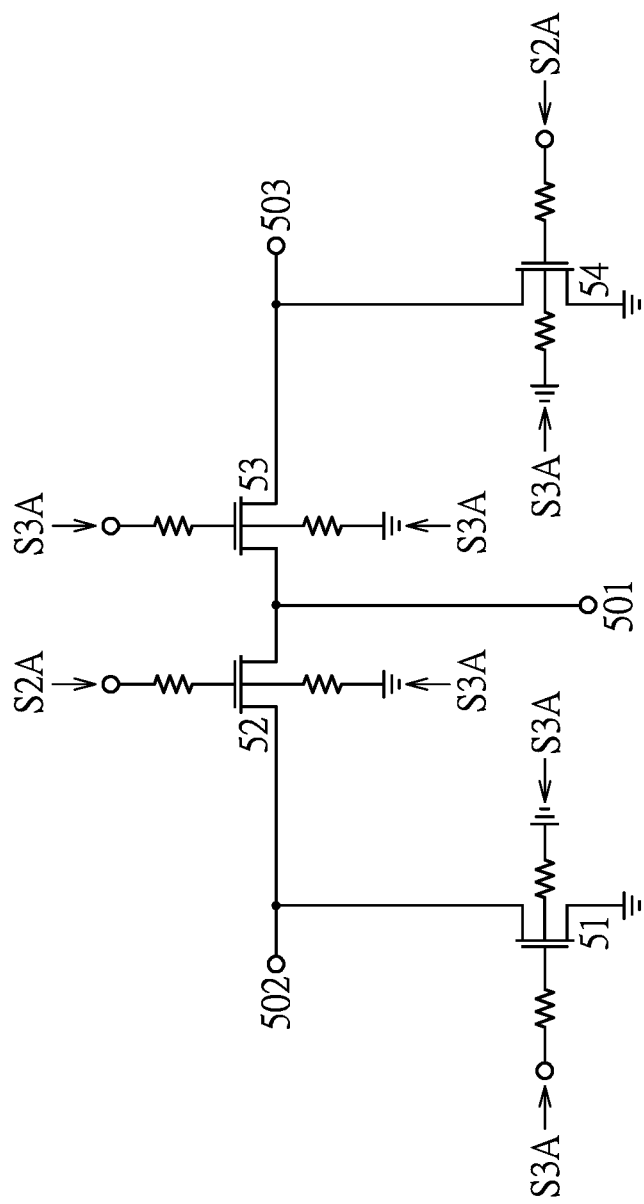
FIG. 2 is a schematic diagram illustrating a switch operating in a first mode according to the first embodiment of the present disclosure.

Specifically, with additional reference to FIG. 2, the switch 5 of the present embodiment is a CMOS single pole double throw (SPDT) switch, which includes a transmit-receive port 1 coupled to the antenna 9, a transmit port 502 coupled to the power amplifier 3, a receive port 503 coupled to the receiver circuit, a first transistor 51, a second transistor 52, a third transistor 53, and a fourth transistor 54. In the present embodiment, the first transistor 51 includes a first terminal coupled to ground, a second terminal coupled to the transmit port 502, and a gate coupled to the envelope tracking bias supply 4, the second transistor 52 includes a first terminal connected to the transmit port 501, a second terminal connected to the transmit-receive port 501, and a gate coupled to the envelope tracking bias supply 4, the third transistor 53 includes a first terminal connected to the transmit-receive port 501, a second terminal coupled to the receive port 503, and a gate coupled to the envelope tracking bias supply 4, and the fourth transistor 54 includes a first terminal connected to the receive port 503, a second terminal coupled to ground, and a gate coupled to the envelope tracking bias supply 4.

Moreover, the switch 5 is coupled to an antenna 9; however, the present disclosure is not limited thereto. The first transistor 51, the second transistor 52, the third transistor 53 and the fourth transistor 54 are floating gate nMOS transistors, and the bodies of the transistors 51, 52, 53, 54 are respectively coupled to ground.

More specifically, in the first mode, with reference to FIG. 2, the envelope tracking bias supply 4 is configured to provide an envelope forward bias signal S2A to the gate of the second transistor 52 and the gate of the fourth transistor 54, and provide an envelope reverse bias signal S3A to the gate of the first transistor 5, the gate of the third transistor 53, and the bodies of the first transistor 51, the second transistor 52, the third transistor 53 and the fourth transistor 54 such that the amplified signal S1A is modulated before being transmitted by the switch 5 to the antenna 9.

Figure 3:
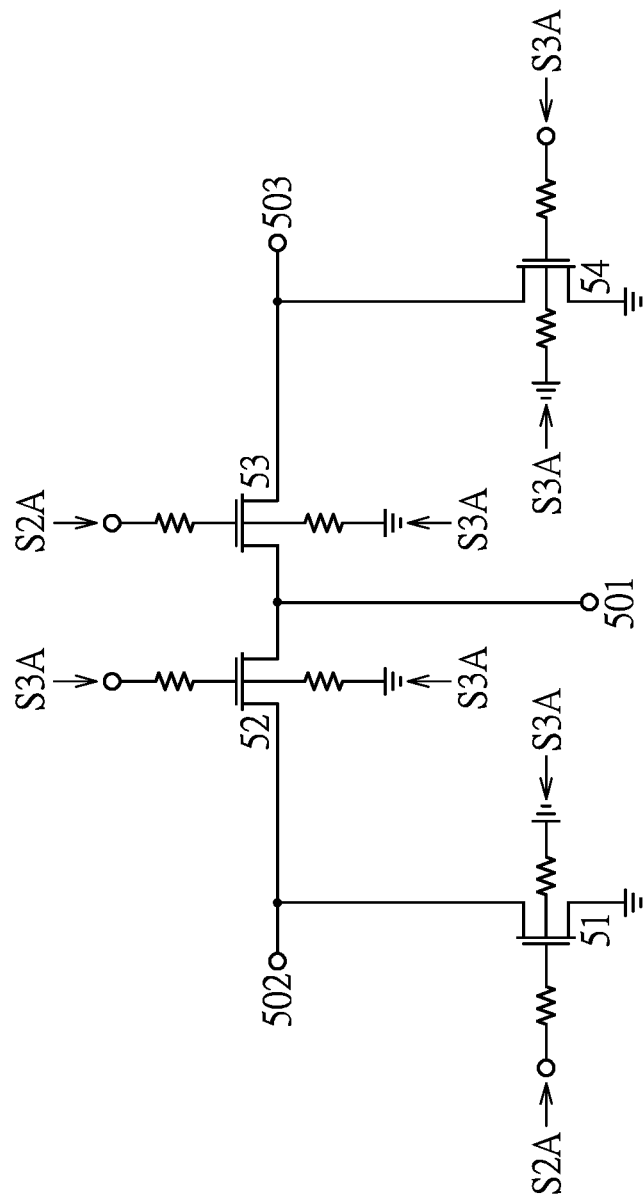
FIG. 3 is a schematic diagram illustrating the switch operating in a second mode according to the first embodiment of the present disclosure.

In the second mode, referring to FIG. 3, the envelope tracking bias supply 4 is configured to provide the envelope forward bias signal S2A to the gate of the first transistor 51 and the gate of the third transistor 53, and provide the envelope reverse bias signal S3A to the gate of the second transistor 52, the gate of the fourth transistor 54, and the bodies of the first transistor 51, the second transistor 52, the third transistor 53 and the fourth transistor 54 such that the second signal S1' is modulated before being transmitted by the switch 5 to the receiver circuit.

In the present embodiment, the envelope forward bias signal S2A is greater than the threshold voltage of the second transistor 52 and the first transistor 51, and the envelope reverse bias signal S3A is lower than the threshold voltage of the first transistor 51 and the third transistor 53 such that the second transistor 52 and the fourth transistor 54 are in on state, and the first transistor 51 and the third transistor 53 are in off state. In this way, the switch 5 acts as an SPDT switch that transmits the amplified signal S1A to the antenna 9 when the transmit port 502 is in signal connection with the transmit-receive port 501, i.e. when the switch operates in the first mode, and transmits a signal from the antenna 9 (the second signal S1') to the receiver circuit when the transmit port 502 is in signal connection with the transmit-receive port 501, i.e. when the switch operates in the second mode.

The envelope tracking bias supply 4 is connected to the switch 5 to enhance the performance thereof. Specifically, the envelope tracking bias supply 4 includes a first wideband linear stage 41 and a second wideband linear stage 42, in which the first wideband linear stage 41 is configured to amplify a received positive amplitude envelope signal S2 and provide an amplified positive amplitude envelope signal to the switch 5 as the envelope forward bias signal S2A, and the second wideband linear stage 42 is configured to amplify a received negative amplitude envelope signal S3 and provide an amplified negative amplitude envelope signal to the switch 5 as the envelope reverse bias signal S3A.

The positive amplitude envelope signal S2 and the negative amplitude envelope signal S3 are envelope signals of the first signal S1, that is, the upper envelope and the lower envelope of the first signal S1. After being amplified by the envelope tracking bias supply 4, the positive amplitude envelope signal S2 and the negative amplitude envelope signal S3 are provided to the switch 5 as the envelope forward bias signal S2A and the envelope reverse bias signal S3A to modulate the amplified signal S1A being transmitted through the switch 5 in a manner such that harmonics and intermodulation distortion that often occurs in a conventional RF switch using constant dc biasing can be reduced. Furthermore, applying the envelope reverse bias signal S3A to the bodies of the first transistor 51, the second transistor 52, the third transistor 53 and the fourth transistor 54 in both the first mode and the second mode allows the PN junction of the nMOS transistors to operate with a greater reverse bias voltage so that current leakage can be prevented.

The linear stage in a conventional envelope tracking circuit serves to provide wide bandwidth and high linearity for data transmission; however, the linear stages of prior art, e.g. as disclosed in Non Patent Citation 1 and Non Patent Citation 2, show deficiency in expanding the operating bandwidth for high bandwidth transmission, e.g. 4×20 MHz for LTE-A carrier aggregation application or 160 MHz for IEEE 802.11 ac/ax. Accordingly, the present disclose provides a wideband linear stage with a circuit structure as disclosed in the first wideband linear stage 41 and the second wideband linear stage 42 to be applied to the switch 5 to increase linearity and reduce power consumption for wide bandwidth data transmission.

In addition, in the present embodiment, the wideband linear stage provided by the present disclosure is also applied to the power amplifier 3 to enhance the performance of the power amplifier 3.

Figure 4:
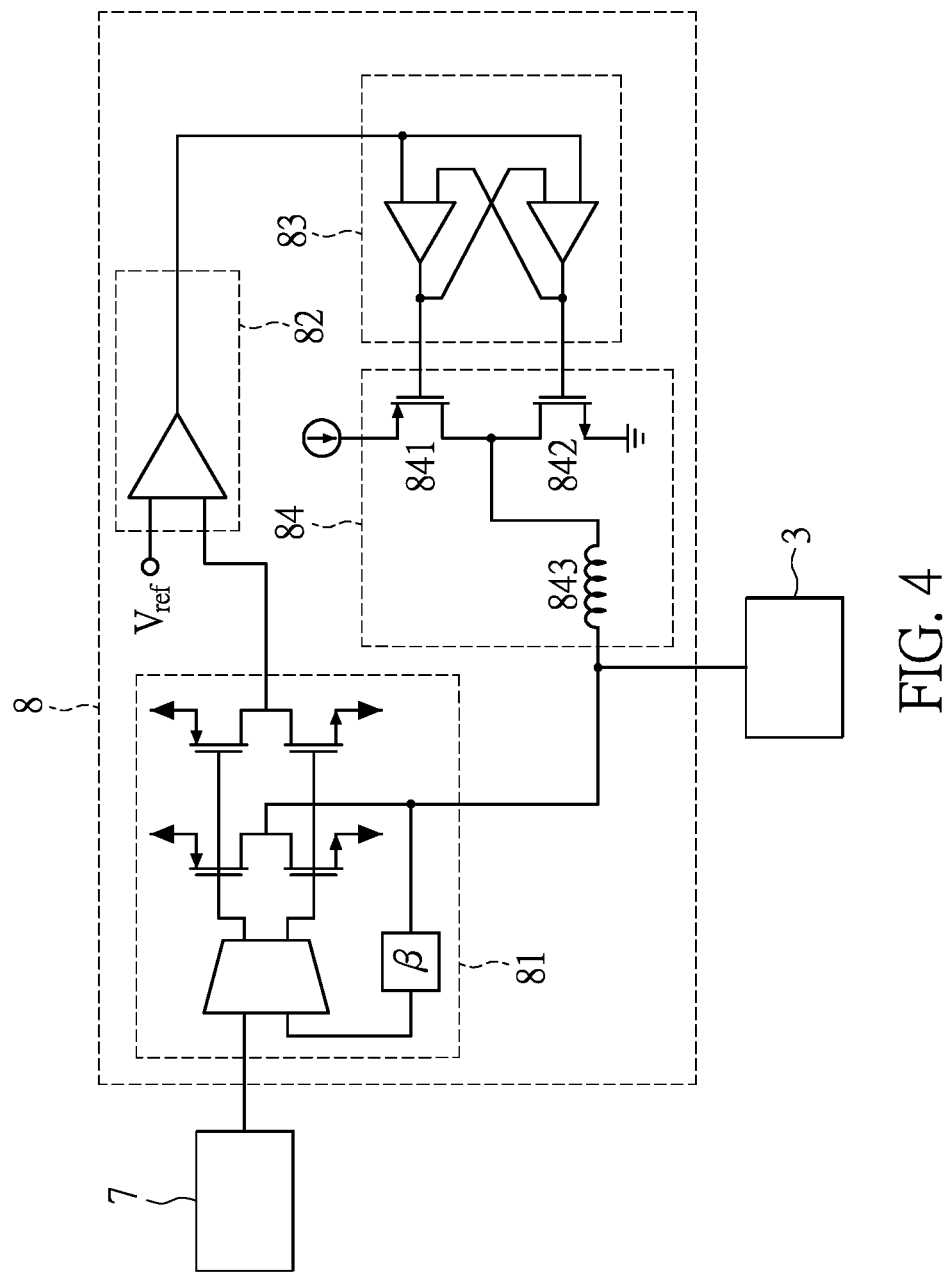
FIG. 4 is a schematic view illustrating an envelope tracking power supply (ETPS) according to the first embodiment of the present disclosure.

Specifically, referring to FIG. 4, the envelope tracking module 1 further includes an envelope tracking power supply 8 coupled between the signal generator 2 and the power amplifier 3. The envelope tracking power supply 8 includes a third wideband linear stage 81, a hysteretic comparator 82, an anti-shoot-through circuit 83, and a switching stage 84. The third wideband linear stage 81, which has the same circuit structure as that of the first wideband linear stage 41 and the second wideband linear stage 42, is configured to receive and amplify an envelope power supply signal S4 (as shown in FIG. 1) from the signal generator 2 and provide an amplified envelope power supply signal S4A to the power amplifier 3.

Moreover, the envelope tracking power supply 8 further includes the hysteretic comparator 82, anti-shoot-through circuit 83 and the switching stage 84 that are coordinated to provide an envelope power (not shown in the drawings) to the power amplifier 3. Specifically, the hysteretic comparator 82 is coupled to the third wideband linear stage 81 and configured to compare the amplified envelope power supply signal S4A with a reference voltage signal $V_{ref}$ so as to provide a reference voltage. The anti-shoot-through circuit 83 is coupled between the hysteretic comparator 82 and the switching stage 82, which is further coupled to the power amplifier 3. The switching stage 84 provides the envelope power in accordance with a switch control signal provided by the anti-shoot-through circuit 83, which generates the switch control signal according to the reference voltage provided by the hysteretic comparator 82.

In the present embodiment, a first envelope shaping device 6 is coupled between the signal generator 2 and the envelope tracking bias supply 4 to provide the envelope tracking bias supply 4 with the positive amplitude envelop signal S2 and the negative amplitude envelop signal S3. Furthermore, a second envelope shaping device 7 is coupled between the signal generator 2 and the envelope tracking power supply 8 to provide the envelope tracking power supply 8 with the envelope power supply signal S4. However, the present disclosure is not limited to the above described. For example, in other embodiments, the signal generator 2 can have envelope shaping function.

Figure 5:
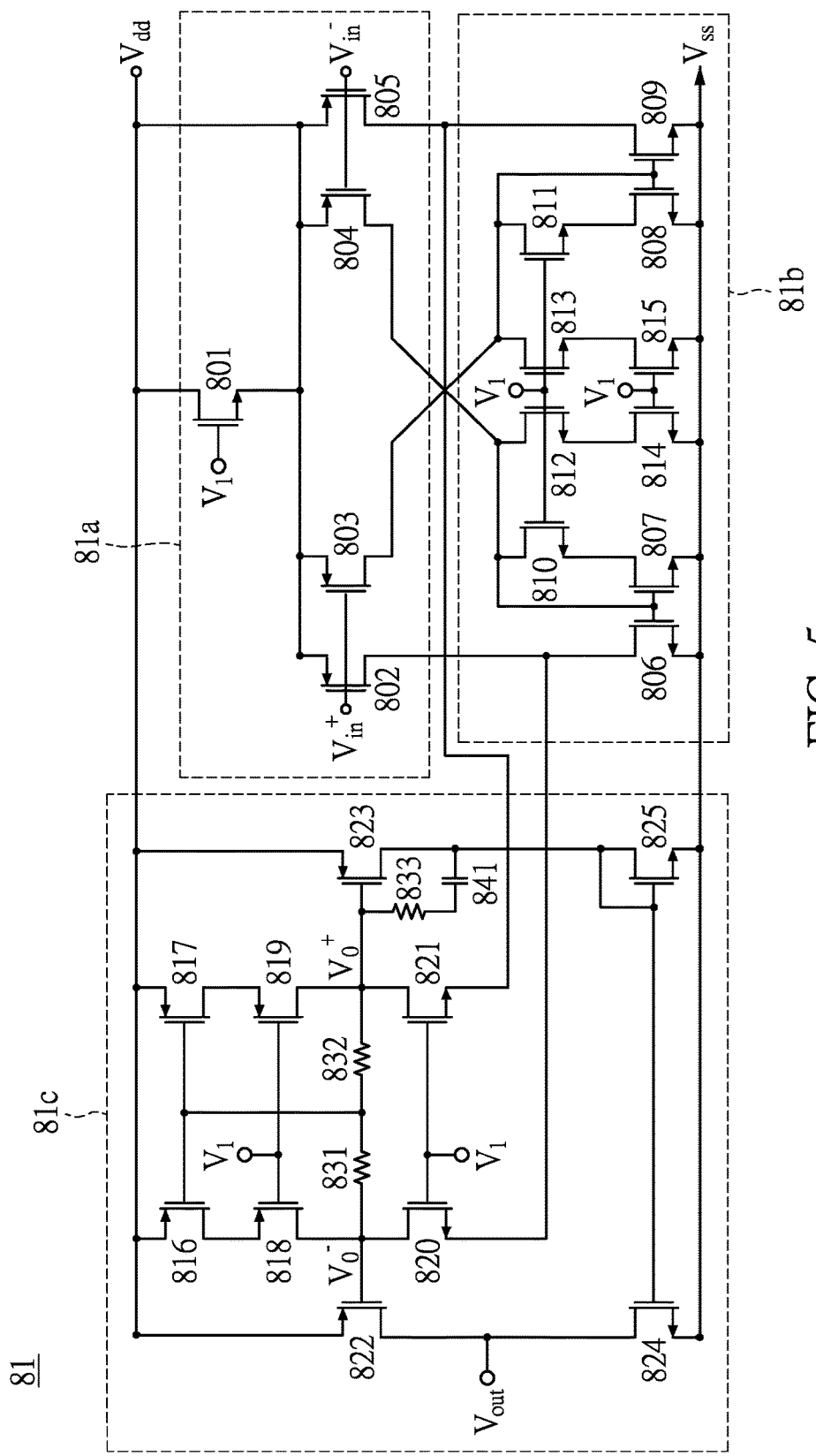
FIG. 5 is a schematic view illustrating a third wideband linear stage according to the first embodiment of the present disclosure.

With reference to FIG. 5, the circuit structure of the first wideband linear stage 41, the second wideband linear stage 42 and the third wideband linear stage 81 are described below. In the figure, the structure of the third wideband linear stage 81 is shown for illustration, and it should be understood that the first wideband linear stage 41 and the second wideband linear stage 42 has the same circuit structure as that of third wideband linear stage 81. The third wideband linear stage 81 includes an input section 81a, an amplification section 81b, and an output section 81c.

The input section 81a includes a bias-current generating transistor 801 and two pairs of input transistors (802, 805), (803, 804) in parallel connection with each other, to which a positive input node $V_{in}^+$ and a negative input node $V_{in}^-$ are connected.

The amplification section 81b includes a plurality of amplification transistors arranged in a plurality of stages, in which at least two pairs of amplification transistors are arranged in a lowermost stage and in parallel connection with each other, and at least one pair of amplification transistors is arranged in each of the other stages of the plurality of stages. In the present embodiment, five pairs of amplification transistors (806, 809), (807, 808), (814, 815), (810, 811), (812, 813) arranged in two stages are used; however, the present disclosure is not limited thereto. As shown in FIG. 5, three pairs of amplification transistors (806, 809), (807, 808), (814, 815) are arranged in a lower stage of the two stages and in parallel connection with each other, and two pairs of amplification transistors (810, 811), (812, 813) are arranged in a higher stage of the two stages and in parallel connection with each.

Moreover, an outer pair of input transistors (802, 805) of the input section 81a is in cascode connection with an outermost pair of amplification transistors (806, 809) arranged in the lower stage, and an inner pair of input transistors (803, 804) of the input section 81a is in cross-cascode connection with one pair of amplification transistors (812, 813) in the higher stage such that a bias current (not shown in the drawings) flowing through a left transistor 803 of the inner pair of input transistors (802, 804) passes through a right transistor 809 of the outermost pair of amplification transistors (806, 809) before leaving the amplification section 81b, and another bias current (not shown in the drawings) flowing through a right transistor 804 of the inner pair of input transistors (803, 804) passes through a left transistor 806 of the outermost pair of amplification transistors (806, 809) before leaving the amplification section 81b. It should be noted that, the present disclosure is not limited to the above-described; the inner pair of input transistors (803, 804) of the input section 81a can also be in cross-cascode connection with the other pair of transistor (810, 811) in the upper stage of the amplification stage 81b in another embodiment.

The output section 81c is connected to the amplification section 81b and includes at least one pair of output transistors, to which an output node \T$_{out}$ is connected. In the present embodiment, three pairs of output transistors (816, 817), (818, 819), (820, 821) are provided to be connected to the positive output node $V_o^+$ and the negative output node $V_o^-$, and two pairs of output transistor (822, 823) are provided to transfer the differential output nodes $V_o^+$, $V_o^-$ to the single output $V_{out}$.

The above mentioned cross connection between the input transistors (803, 804) and the amplification transistors (812, 813) creates two signal paths for the bias current to be reused so that gain boosting of the third wideband linear stage is achieved.

Furthermore, with the structure of the third wideband linear stage 83, the output transconductance thereof is correlated to the width ratio of the transistors 806, 807, 814. Therefore, the output transconductance can be increased by allocating the width ratio of the transistors 806, 807, 814, thereby obtaining transconductance boosting. Since the output gain boosting is obtained by multiplying the output resistance by the output transconductance, the gain boosting can be obtained. To be specific, the characteristics of cross connection and the allocation of the transistor width ratio in the first, second and third wideband linear stages are provided to enhance the gain of the first, second and third wideband linear stages.

Figure 6A:
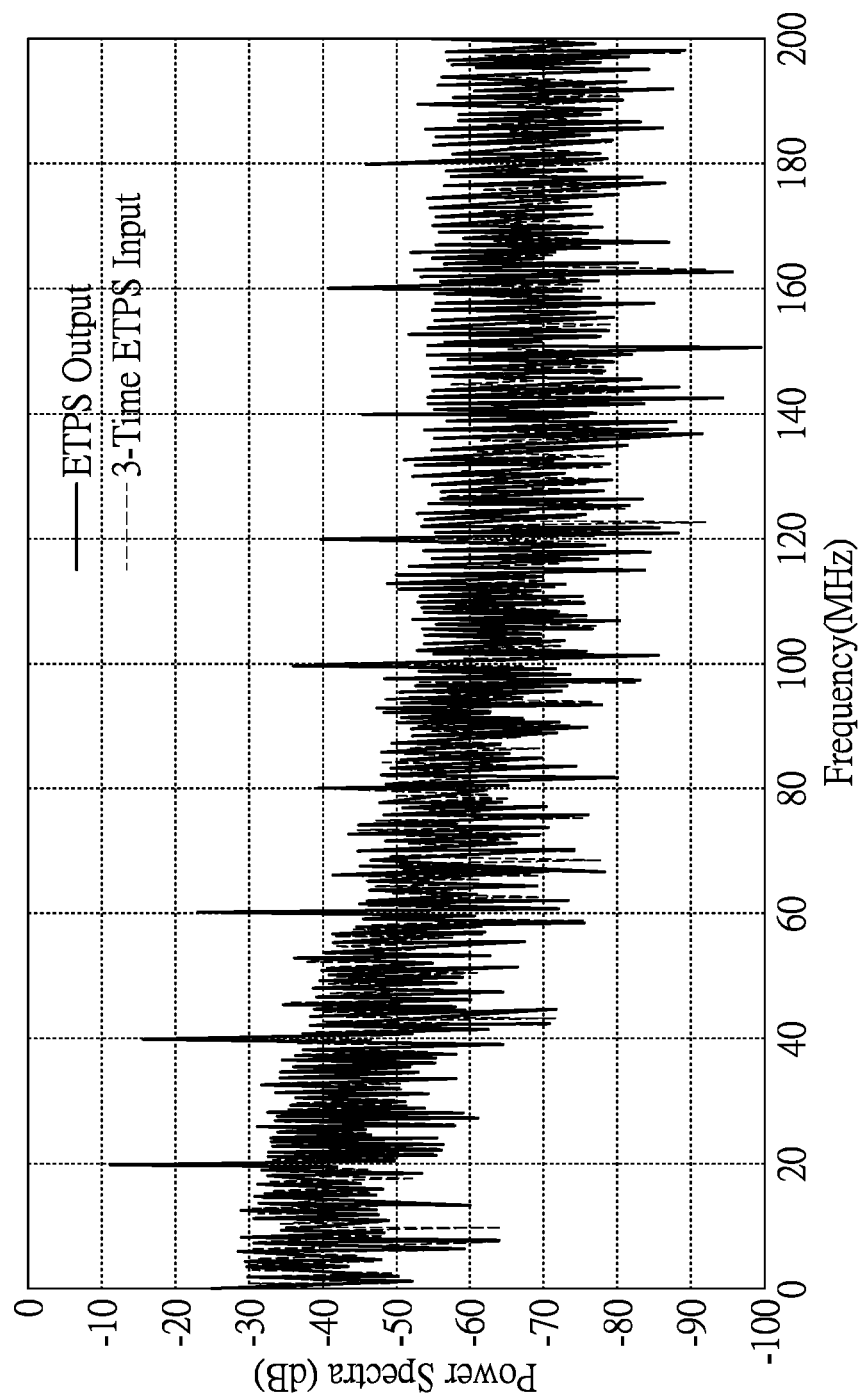
FIGS. 6A, 6B and 6C are diagrams respectively showing measured power spectra of output and 3-time input signals of the ETPS according to the first embodiment of the present disclosure, measured efficiency of the ETPS according to the first embodiment of the present disclosure and measured waveforms of input and output signals of an envelope tracking bias supply (ETBS) according to the first embodiment of the present disclosure.
Figure 6B:
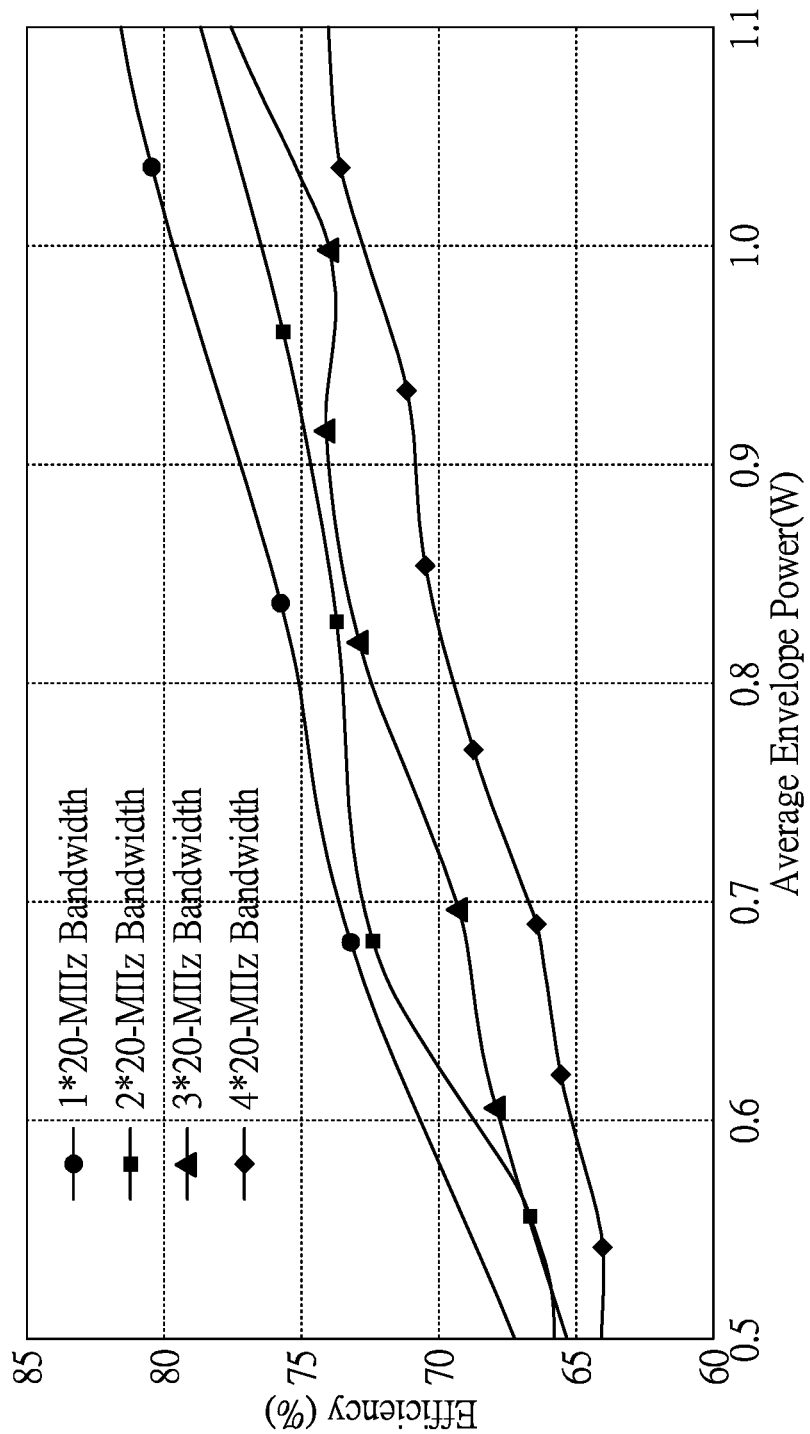
Figure 6C:
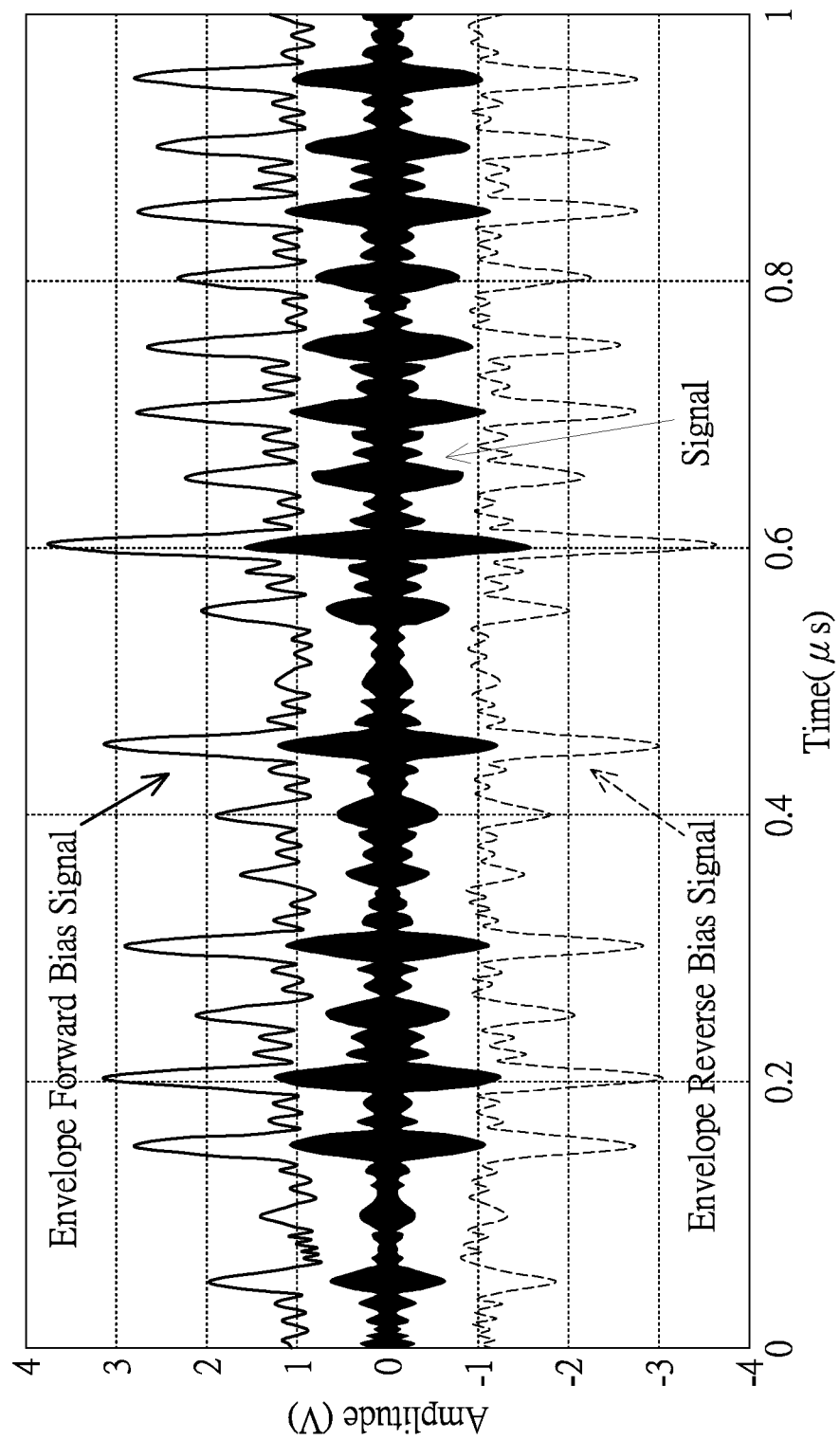

The efficacy of the first, second and third wideband linear stages 41, 42, 81 are shown with measured data in FIGS. 6A to 6C. With reference to FIG. 6A, which shows measured power spectra of output signals of the envelope tracking power supply (ETPS) 8 and 3-time input signals of the ETPS 8 according to the present embodiment, the measurement was conducted for 4×20 MHz bandwidth LTE-A carrier aggregation (CA) signal. The results in FIG. 6A indicate good agreement between input and output signals of the ETPS 8. FIG. 6B shows measured efficiency of the ETPS 8 with various envelope output powers for 1×20, 2×20, 3×20, 4×20 MHz bandwidth LTE-A CA signals, which indicates high efficiency for operating bandwidth higher than 1×20 MHz. FIG. 6C shows measured waveforms of input and output signals of the envelope tracking bias supply (ETBS) 4 of the present embodiment, which also indicates good agreement between input signals and output signals of the ETBS 4.

Figure 7A:
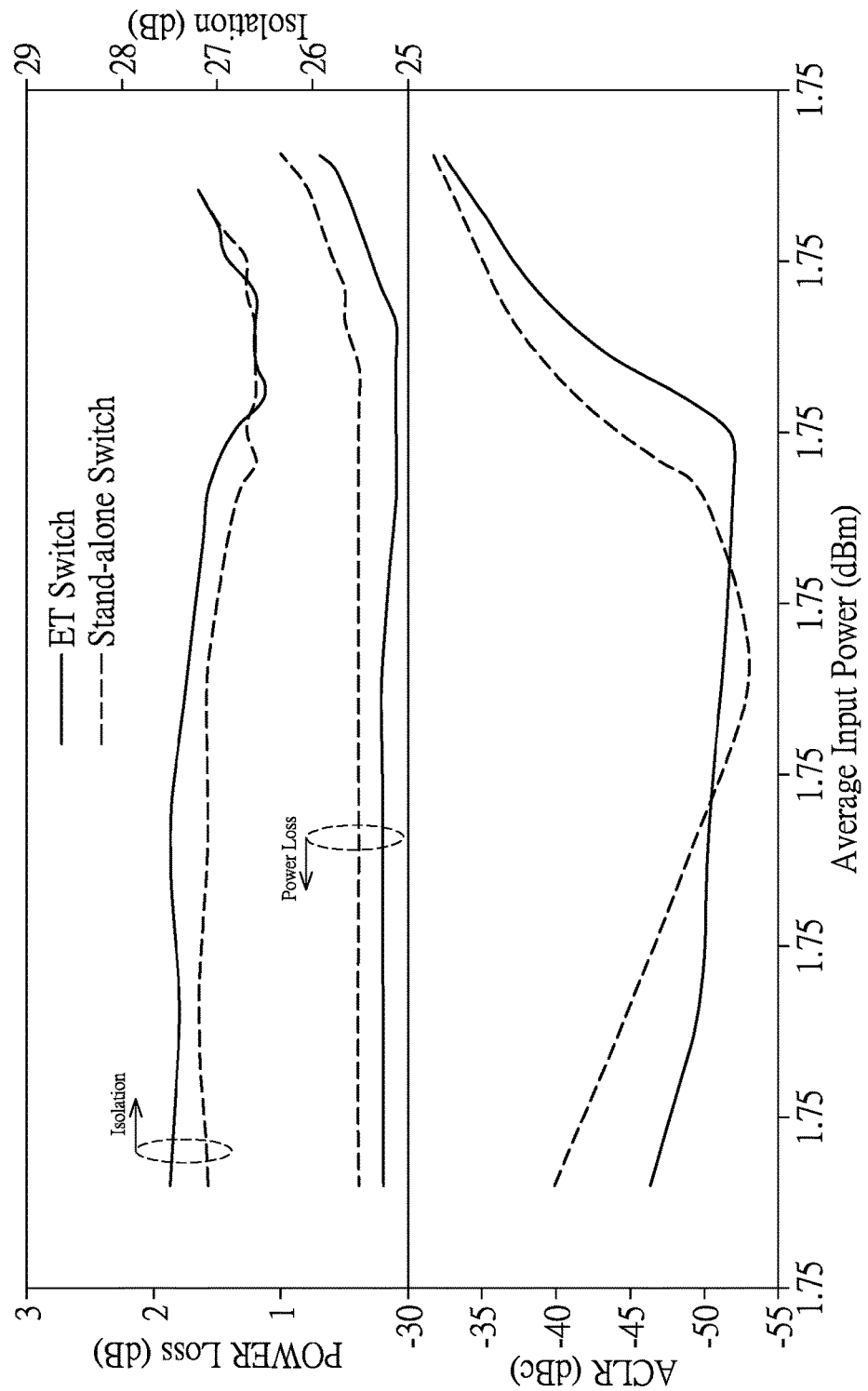
FIGS. 7A and 7B are diagrams showing measured power loss, isolation performance, adjacent channel leakage ratio (ACLR), and error vector magnitude (EVM) of the switch incorporated with the ETBS according to the first embodiment of the present disclosure, with that of a standalone switch for comparison.
Figure 7B:
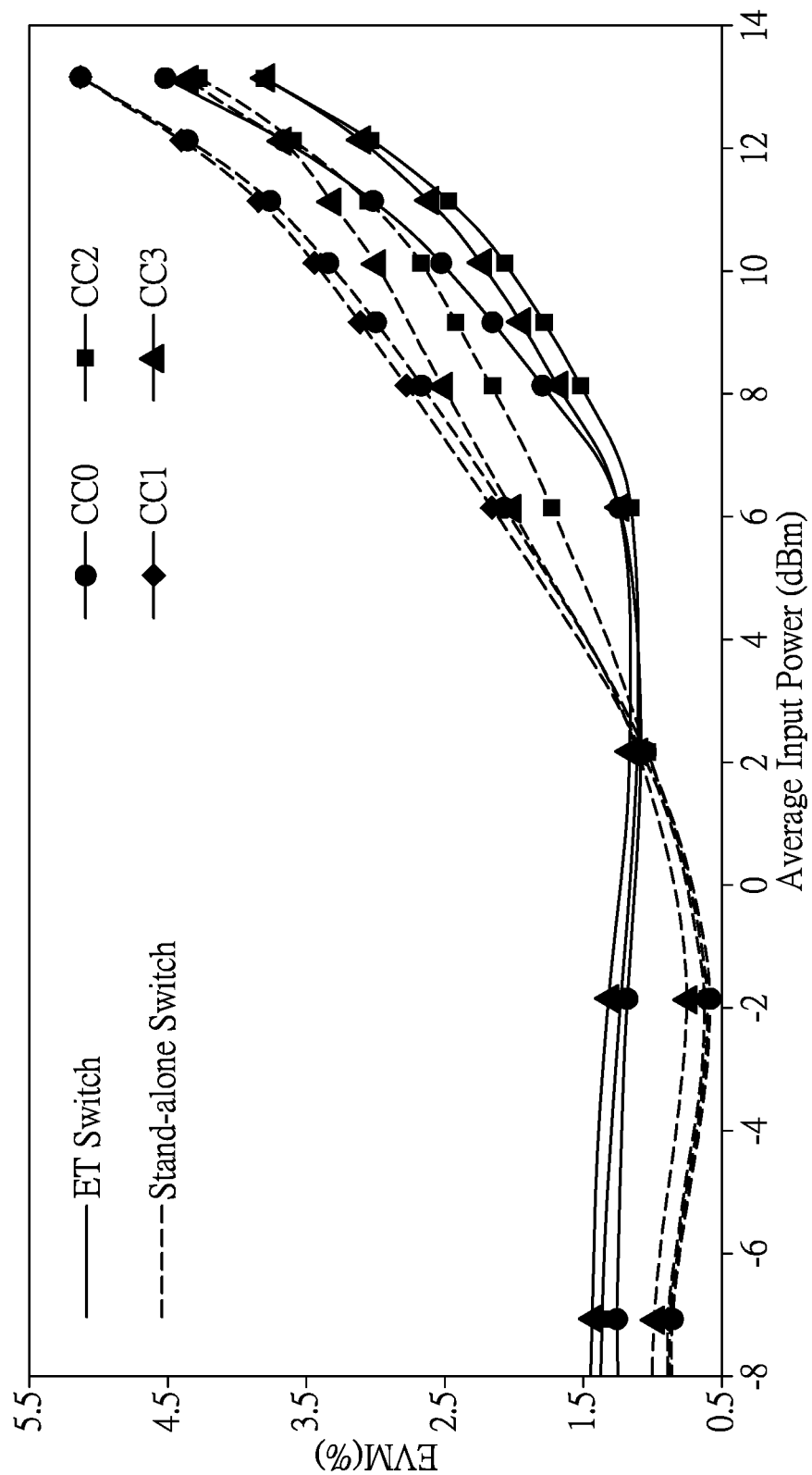

Reference is made to FIGS. 7A and 7B, which show the measured power loss, isolation performance, adjacent channel leakage ratio (ACLR), and error vector magnitude (EVM) of the switch 5 incorporated with the ETBS 4 with various average input powers for the 1.95 GHz 64-QAM LTE-A CA signal with 4×20 MHz bandwidth, in which CC0 to CC4 curves represent each component carrier. From the figures it can be seen that the switch 5 combined with the ETBS 4 (ET Switch) exhibits higher isolation performance, lower power loss, lower ACLR (FIG. 7A) and lower EVM (FIG. 7B) for wide bandwidth signals, which shows that the ET switch achieves higher linearity and higher power handling capacity when operating with wide bandwidth signals.

In addition to providing the power amplifier 3 with envelope tracking, the power amplifier 3 being able to operate in multiple power modes is critical as well for better linearity performance and lower power consumption. Conventional solutions to achieve multipower modes power amplifier, e.g. tunable matching network and multipath architecture, increase the cost, size and structural complexity of the power amplifier. Accordingly, the present disclosure provides the power amplifier 3 that is able to operate in multiple power modes.

Figure 8:
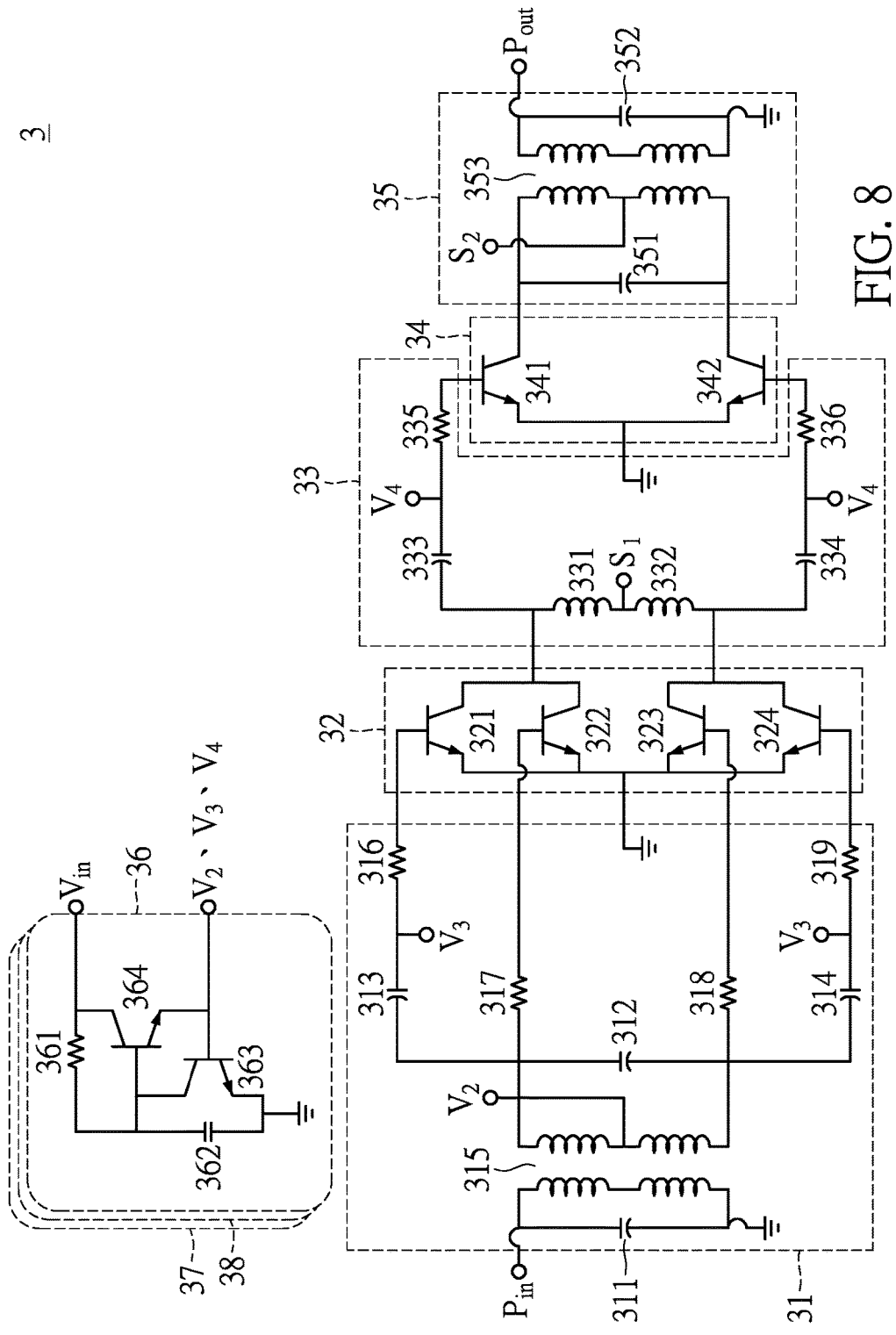
FIG. 8 is a schematic view illustrating a power amplifier according to the first embodiment of the present disclosure.

Specifically, referring to FIGS. 1 and 8, the power amplifier 3 of the envelope tracking frontend device Z includes a driver stage 32, a power stage 34, a first matching circuit 31 coupled between the signal generator 2 and the driver stage 32, a second matching circuit 33 coupled between the driver stage 32 and the power stage 34, and a third matching circuit 35 coupled between the power stage 34 and the switch 5.

In the present embodiment, the first matching circuit 31 is an input balun, the second matching circuit 33 is an interstage matching network, and the third matching circuit 35 is an output transformer.

The first signal S1 provided from the signal generator 2 is transmitted through the first matching circuit 31, the driver stage 32, the second matching circuit 33, the power stage 34, and the third matching circuit 35, and then provided via the third matching circuit 35 as the amplified signal S1A. The driver stage 32 and the power stage 34 are respectively configured to receive the amplified envelope power supply signal S4A such that the first signal S1 is modulated in the driver stage 32 and the power stage 34.

The power amplifier 3 is characterized in that the driver stage 32 includes a plurality pairs of driver transistors arranged in a discrete-resizing structure. In the present embodiment, the driver stage 32 includes two pairs of driver transistors (321, 324), (322, 323) arranged in the discrete resizing structure; however, the present disclosure is not limited thereto. In the discrete-resizing structure, each pair of driver transistors (321, 324), (322, 323) are in parallel connection with one another, and includes two transistors having the same number of emitter stripes. In other words, transistor 321 and transistor 324 have the same number of emitter stripes, and transistor 322 and transistor 323 have the same number of emitter stripes. Each pair of drive transistors (321, 324), (322, 323) is configured to be driven independently such that the power amplifier operates in multiple modes.

In this embodiment, the power amplifier 3 further includes three adaptive bias circuits 36, 37, 38 respectively providing a bias voltage V2, V3, V4 to bias the driver stage 32 and the power stage 34.

Referring to the equation shown below, wherein $V_{cc}$ is collector voltage of the transistor, $V_{knee}$ is the knee voltage of the transistor, and N is the number of emitter stripes of the transistors, the power amplifier 3 operating in two power modes is designed by manipulating the collector voltage $V_{cc}$ and the number of emitter stripes N of the transistors.

$$P_{out}=[(V_{cc}-V_{knee})\times(N\times I_{cc})]/2$$

The supply voltages S1, S2 and the number of emitter stripes N for the driver stage 32 and the power stage 34 can be determined by referring to the design graphic charts of collector voltage $V_{cc}$ versus the input power for the power stage 34, and that of collector voltage $V_{cc}$ versus the number of emitter stripes for the driver stage 32. The present disclosure is not limited by the chosen value of supply voltages S1, S2 and the chosen number of emitter stripes N.

Figure 9:
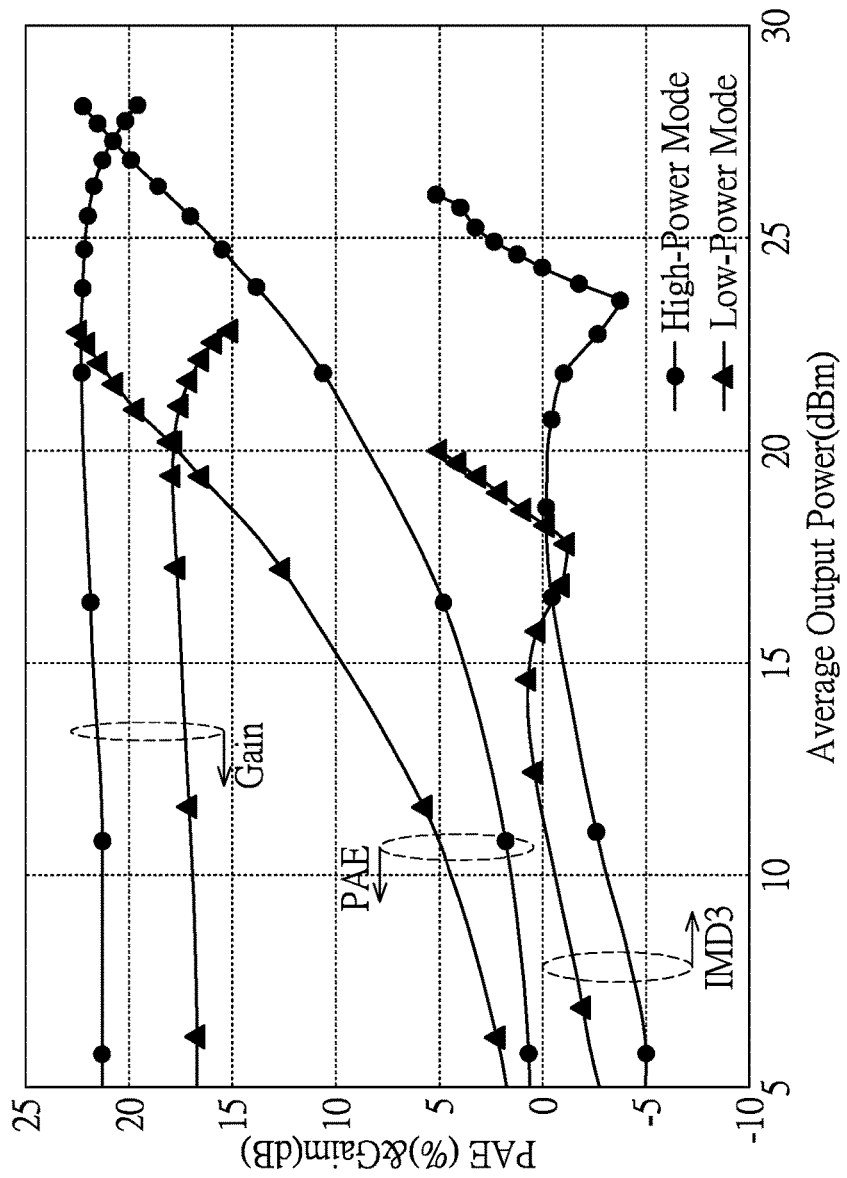
FIG. 9 is a diagram showing measured gain, power-added efficiency (PAE) and two-tone third-order intermodulation distortion (IMD3) of the power amplifier of the first embodiment of the present disclosure in a high-power mode and a low power mode respectively.

With reference to FIG. 9, which shows measured gain, power-added efficiency (PAE) and two-tone third-order intermodulation distortion (IMD3) of the power amplifier 3 of the present embodiment in a high power mode and a low power mode respectively, FIG. 9 shows that the power amplifier 3 working in the high power mode produces higher gain that working in the lower power mode, indicating that the power amplifier 3 is able to operates in two distinct power modes without using a tunable matching network, thereby achieving linearity without sacrificing the cost and size of the power amplifier.

Figure 10A:
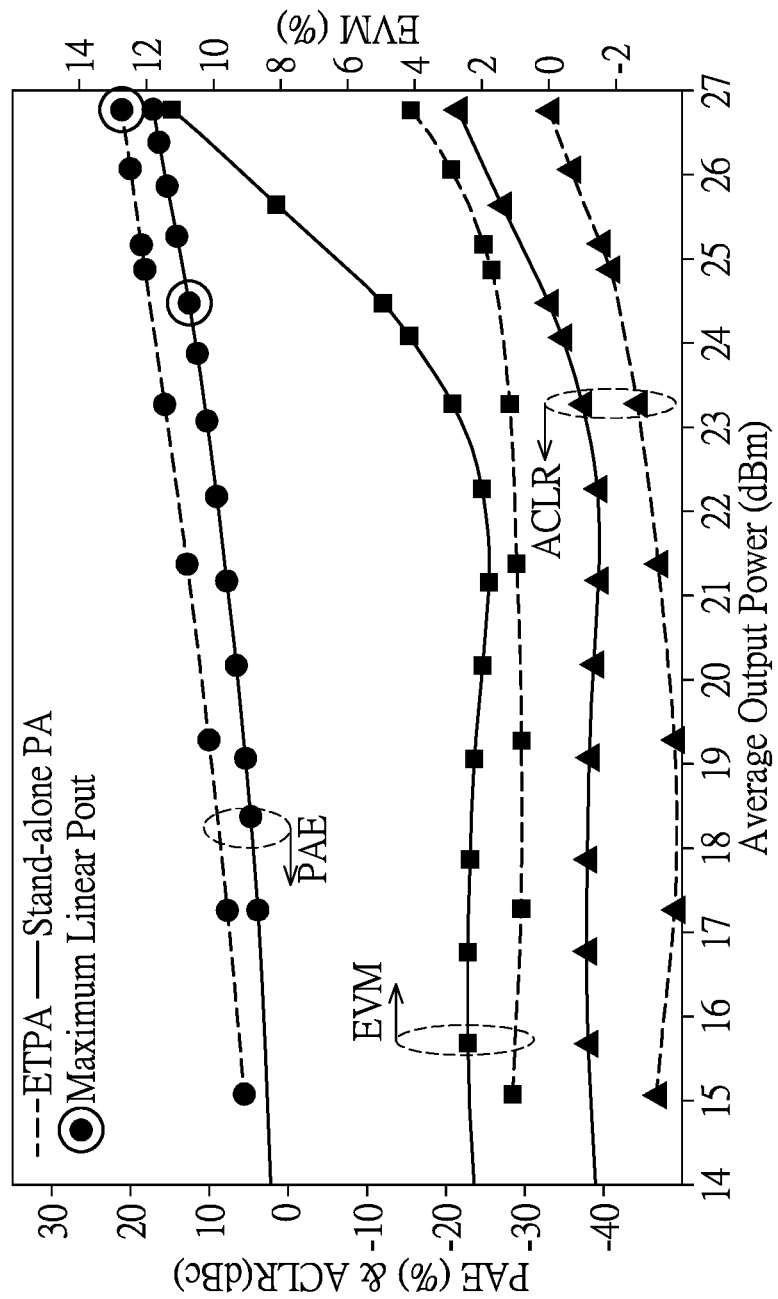
FIGS. 10A, 10B and 10C are diagrams showing measured ACLR, EVM and PAE of an envelope tracking power supply (ETPA) according to the first embodiment of the present disclosure with that of the standalone power amplifier for comparison.
Figure 10B:
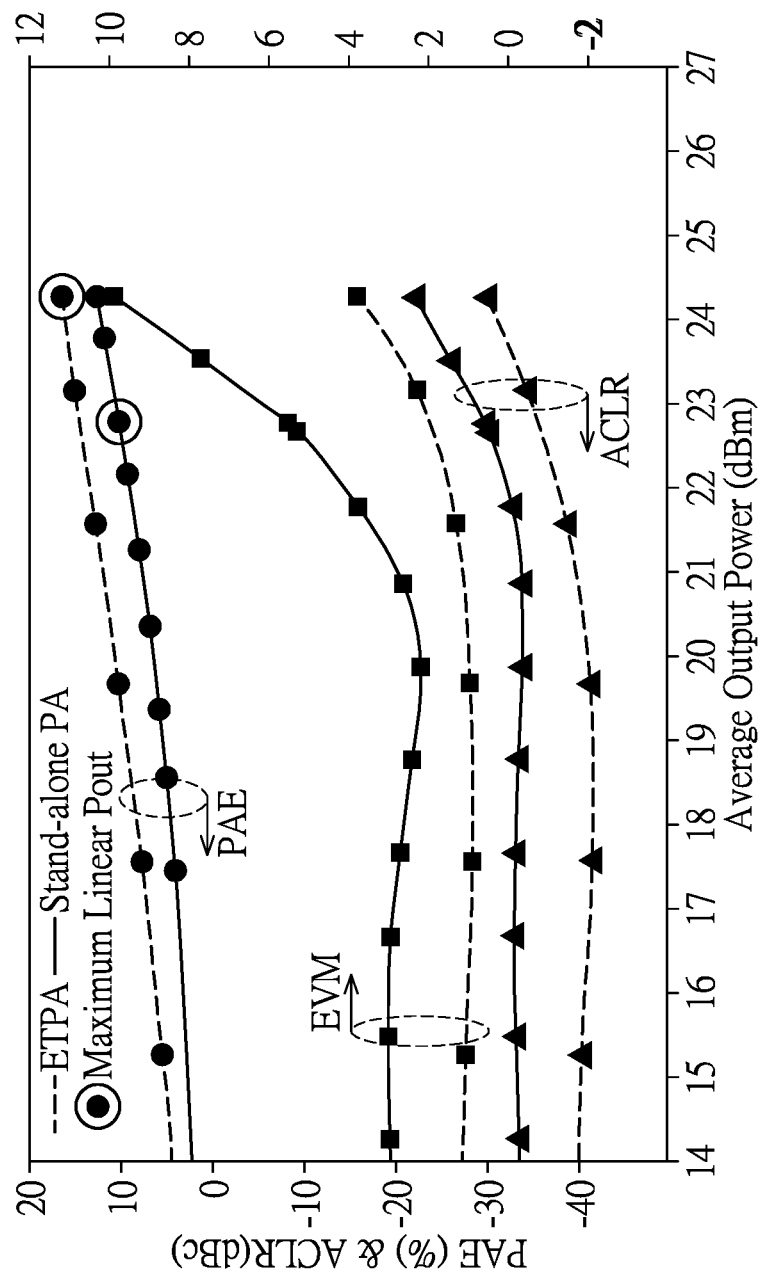
Figure 10C:
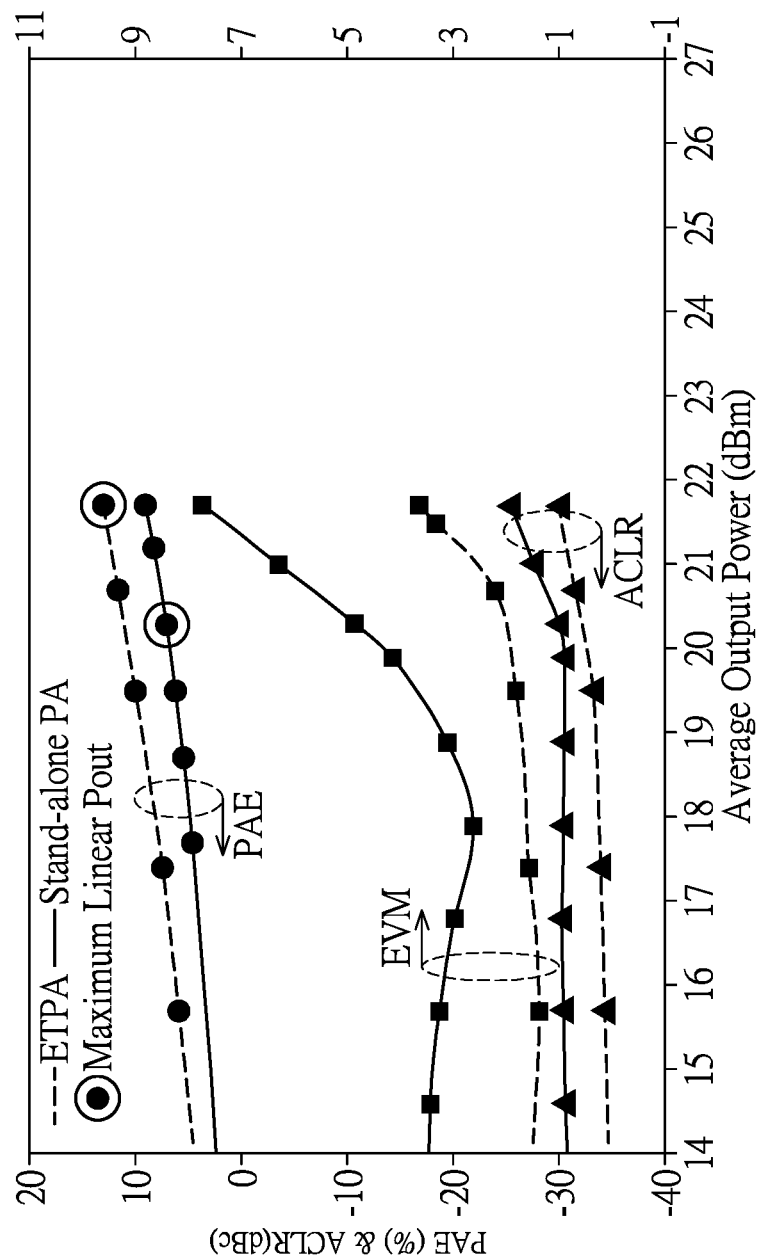
Figure 10D:
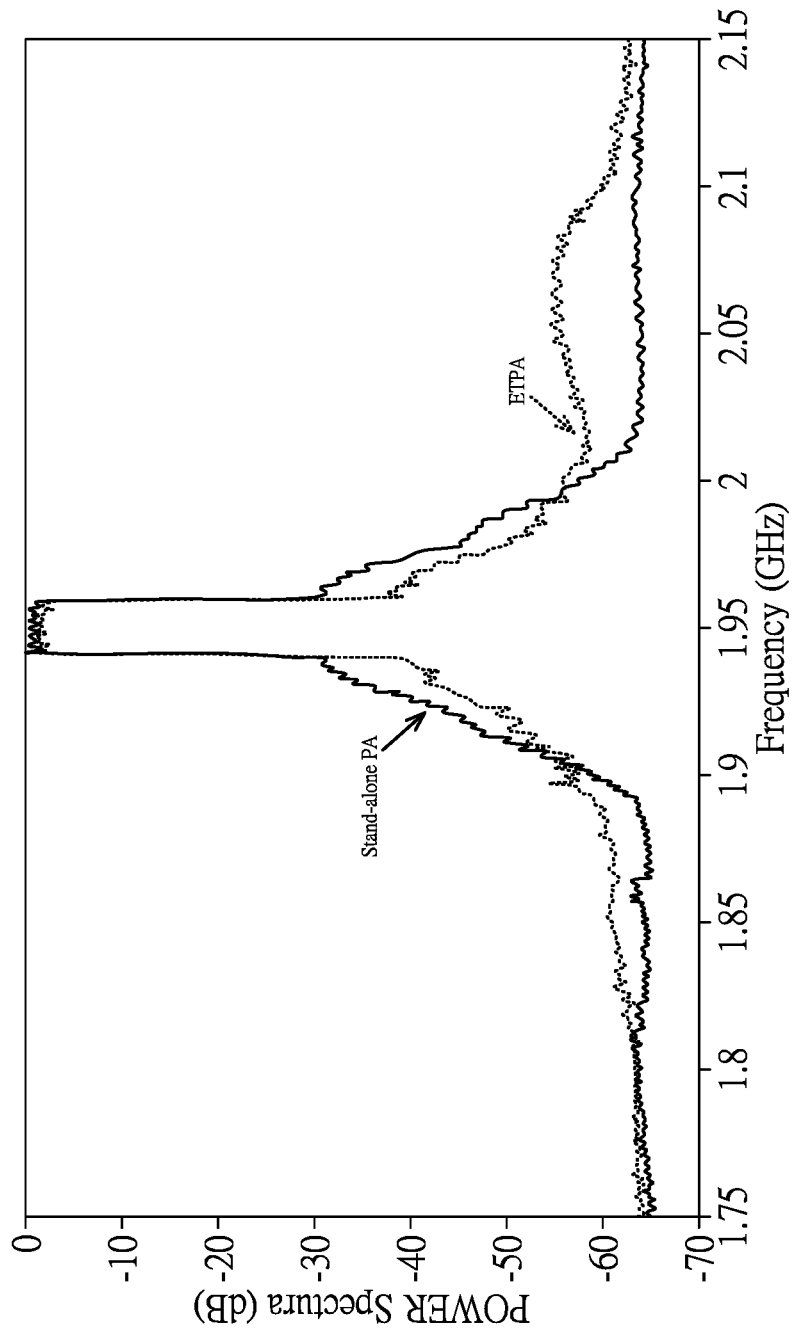
FIGS. 10D, 10E, 10F and 10G are diagrams showing measured power spectra of output signals of the ETPA of the first embodiment with that of the standalone power amplifier for comparison.
Figure 10E:
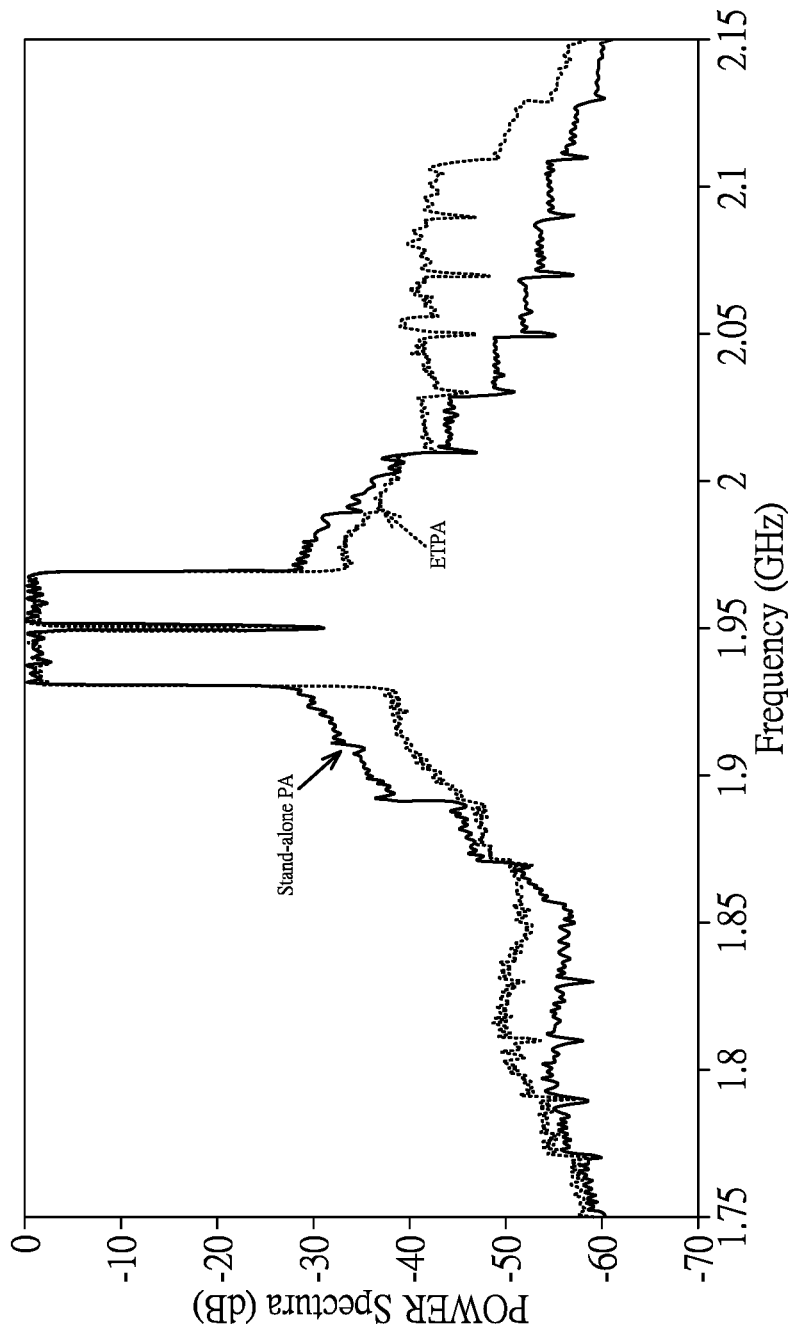
Figure 10F:
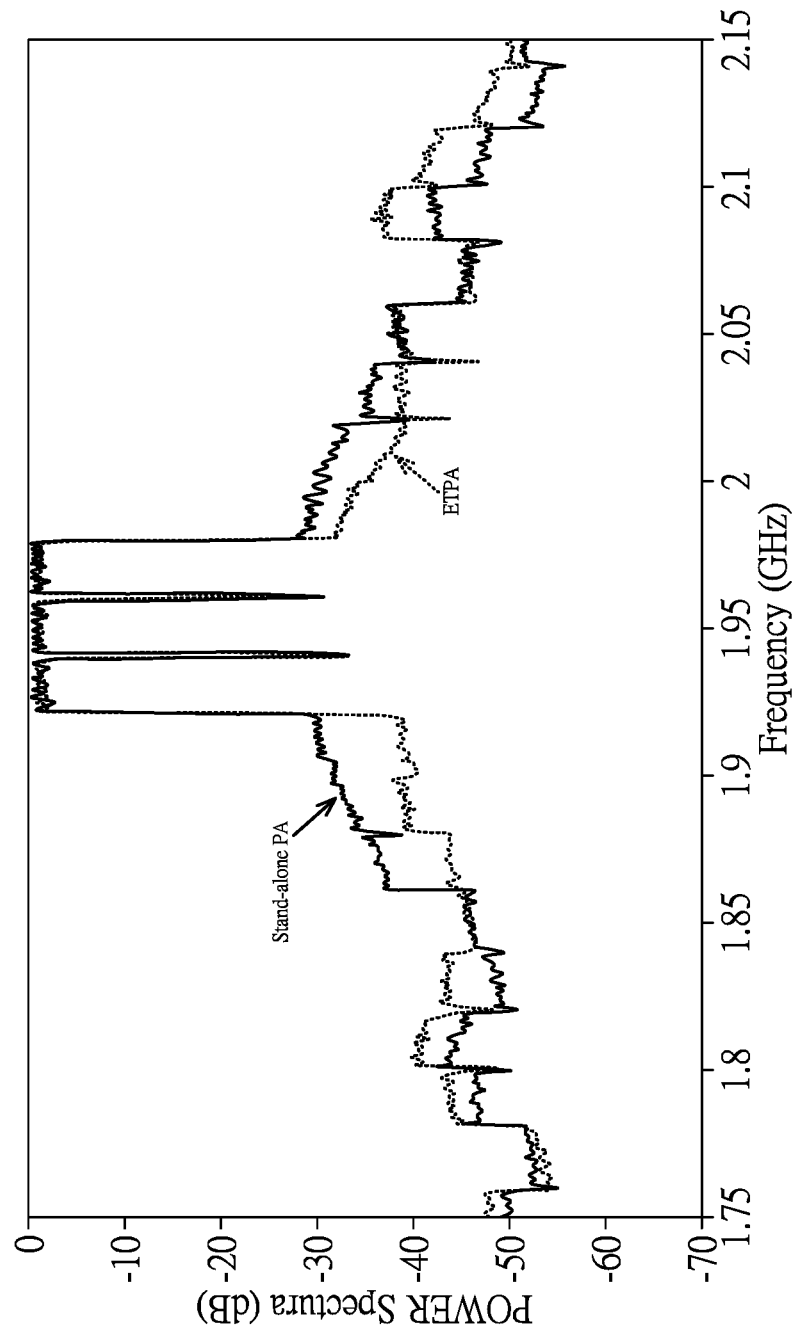
Figure 10G:
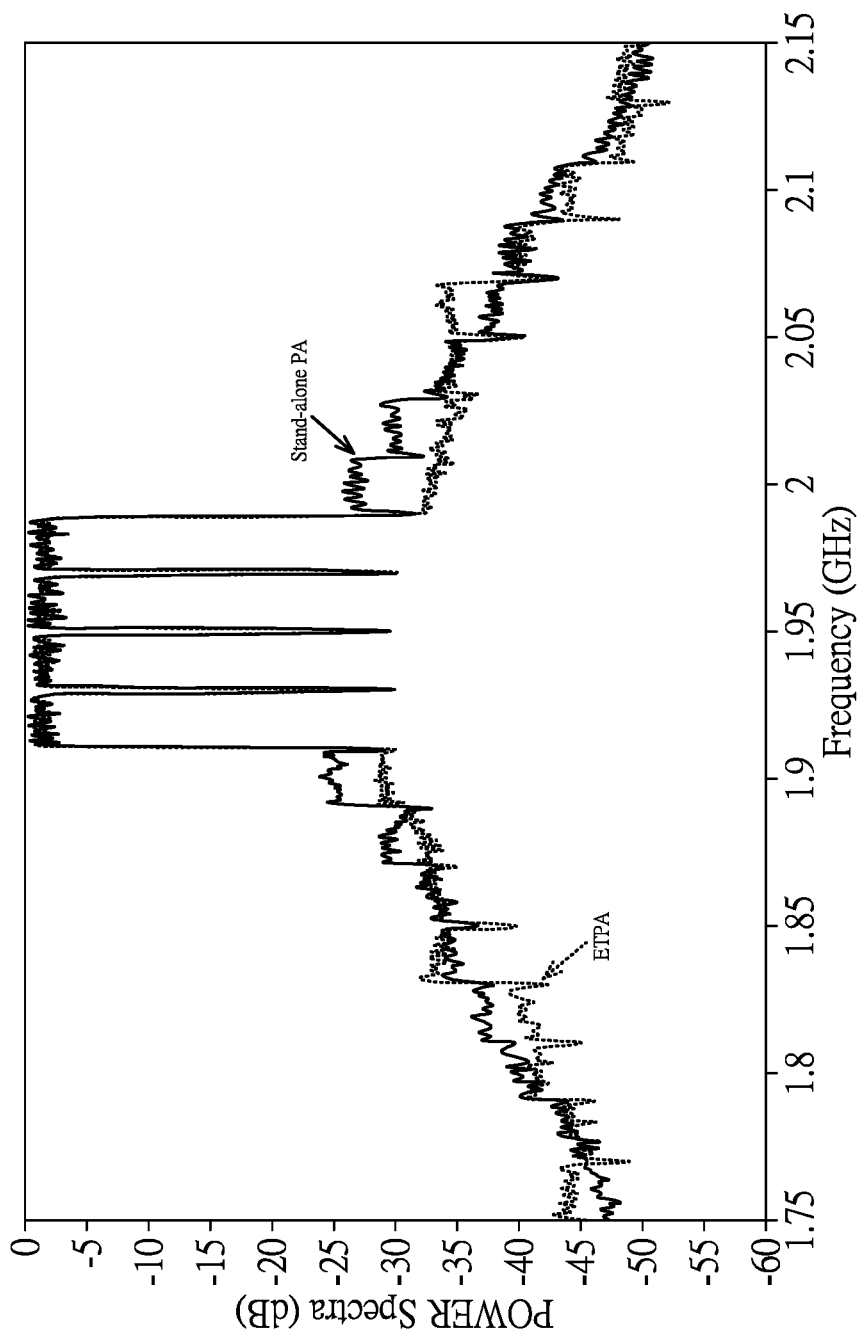

In the present embodiment, the ETPS 8 is applied to modulate the power amplifier 3, forming an envelope tracking power supply (ETPA) to enhance the performance thereof. Referring to FIGS. 10A to 10C, measured adjacent channel leakage ratio (ACLR), error vector magnitude (EVM) and PAE of the ETPA of the present embodiment operating with signals of 1×20 MHz (FIG. 10A), 2×20 MHz (FIG. 10B), 3×20 MHz (FIG. 10C) bandwidths are shown with that of standalone power amplifier 3 for comparison. It is shown in FIGS. 10A to 10C that the PAE curves of the ETPA of the present embodiment are above that of the standalone power amplifier 3, which indicates higher efficiency performance is achieved by the ETPA of the present embodiment. In addition, the EVM curves and the ACLR curves of the ETPA of the present embodiment are below that of the standalone power amplifier 3, showing higher linearity is also achieved by the ETPA of the present embodiment.

Furthermore, referring to FIGS. 10D to 10G, which show measured power spectra of the ETPA of the present embodiment for 1×20 MHz (FIG. 10D), 2×20 MHz (FIG. 10E), 3×20 MHz (FIG. 10F), 4×20 MHz (FIG. 10G) bandwidth LTE-A signals with that of standalone power amplifier 3 for comparison. Compared to the curves of standalone power amplifier 3, the power spectra curves of the ETPA of the present embodiment have relatively lower skirt spectrum, which indicates lower ACLR. That is to say, when operating with high bandwidth CA signals, the ETPA of the present embodiment exhibits high linearity and efficiency performances.

Figure 11:
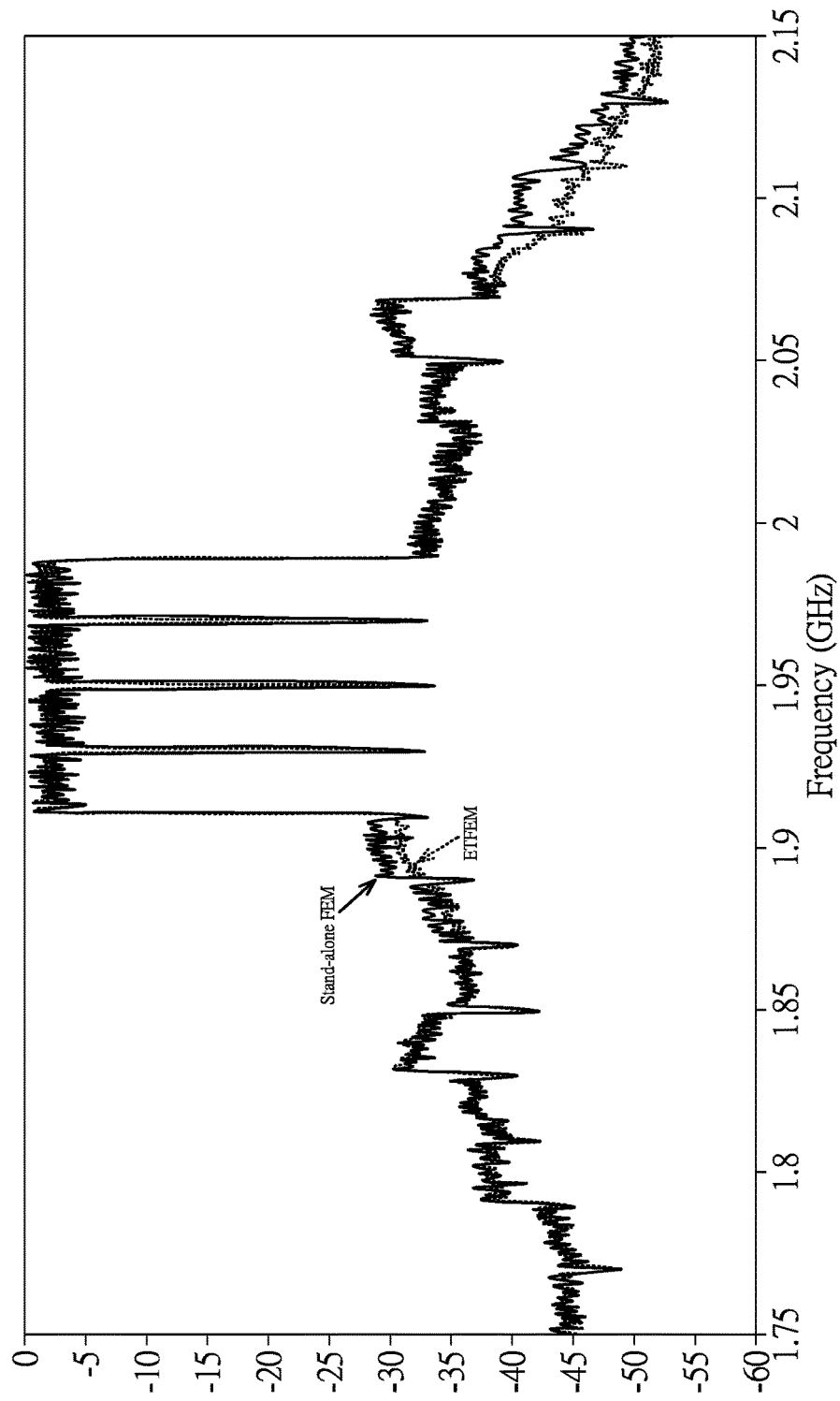
FIG. 11 is a diagram showing measured power spectra of the envelope tracking frontend device according to the first embodiment of the present disclosure with that of a standalone frontend device for comparison.

In addition, FIG. 11 shows measured power spectra of the envelope tracking frontend device Z for 1.95 GHz 64-QAM LTE-A CA signal with 4×20 MHz bandwidth with that of a standalone frontend device for comparison. Results shown in FIG. 11 indicate the envelope tracking frontend device Z of the present embodiment operates with lower ACLR for high bandwidth CA signals.

It should be noted that, although the envelope tracking frontend device Z is applied to LTE-A CA signals with 1×20 MHz, 2×20 MHz, 3×20 MHz and 4×20 MHz bandwidths in this embodiment, the present disclosure is not limited thereto.

The table below presents a comparison between the ETPA of the present disclosure and that of Non Patent Citations 1 to 3.

|  | Modulation | Efficiency Enhancement (%) | EVM Enhancement (%) | ACLR Enhancement (%) | ETPS Efficiency (%) |
|---|---|---|---|---|---|
| Non Patent Citation 1 | 802.11 g 16-QAM 20 MHz | 47.3 | 0 | — | 65 |
| Non Patent Citation 2 | LTE 16-QAM 20 MHz | 17 | 0 | — | 78.83 |
| Non Patent Citation 3 | LTE 16-QAM 5 MHz | 8.3 | — | — | 81 |
| Present Disclosure | LTE-A 16-QAM 60 MHz | 43.8 | 4.1 | 4.7 | 74 |
|  | LTE-A 16-QAM 40 MHz | 30 | 6.1 | 7.9 | 76.4 |
|  | LTE-A 16-QAM 20 MHz | 24.9 | 7.1 | 11.7 | 79.6 |

The comparison shown above indicates that the ETPA of the present embodiment achieves high efficiency and high linearity compared to Non Patent Citations 1 to 3.

The Second Embodiment

Figure 12:
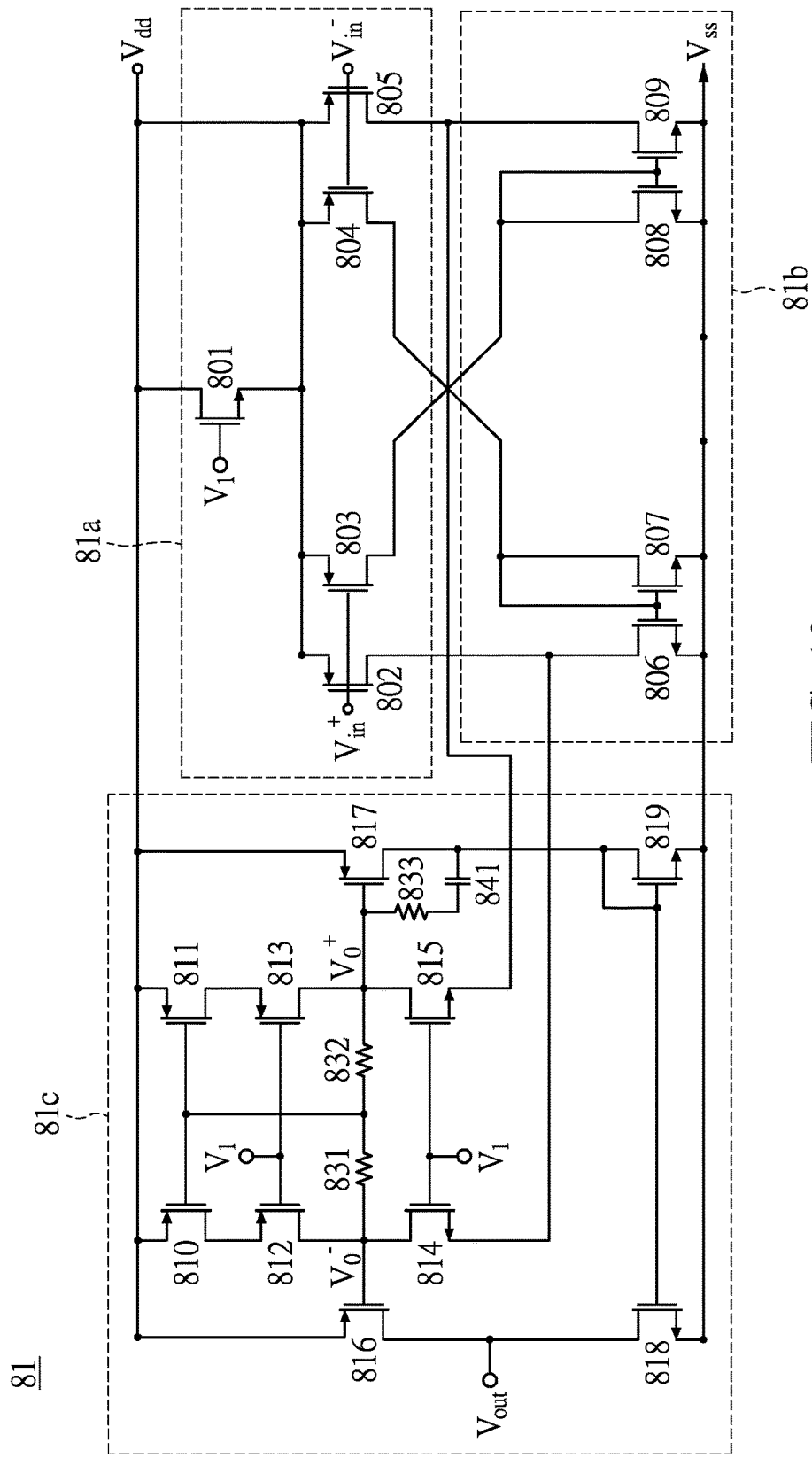
FIG. 12 is a schematic view illustrating a third wideband linear stage according to a second embodiment of the present disclosure.

With reference to FIG. 12, in another embodiment of the present disclosure, the envelope tracking frontend module Z can have a first wideband linear stage 41, a second wideband linear stage 42, and a third wideband linear stage 81 of the structure shown in FIG. 12. The difference between the wideband linear stages of the present embodiment and those of the first embodiment is that, in the present embodiment, the amplification section 81b section includes at least two pairs of amplification transistors in parallel connection with each other. The present embodiment uses two pairs of amplification transistors (806, 809), (807, 808) as example; however, the present disclosure is not limited thereto. The amplification transistors of the present embodiment are arranged in one stage, and an outer pair of input transistors (802, 805) of the input section 81a is in cascode connection with the outermost pair of amplification transistors (806, 809), and an inner pair of input transistors (803, 804) of the input section is in cross-cascode connection with one pair of amplification transistors (807, 809) other than the outermost pair of amplification transistors (806, 809).

In this manner, a bias current flowing through a left transistor 803 of the inner pair of input transistors passes through a right transistor 809 of the outermost pair of amplification transistors before leaving the amplification section 81b, and another bias current flowing through a right transistor 804 of the inner pair of input transistors passes through a left transistor 806 of the outermost pair of amplification transistors before leaving the amplification section 81b, thereby achieving dual path bias current in which the bias current is reused in two signal paths In summary, the present disclosure is advantageous in that the envelope tracking frontend device Z and the switch 5 thereof can achieve "the amplified signal S1A is modulated before being transmitted to the antenna 9 by the switch 5" and "the second signal S1' is modulated before being transmitted to the receiver circuit by the switch 5" with the technical feature of "the envelope tracking bias supply 4 is configured to provide an envelope forward bias signal S2A to the gate of the second transistor 52 and the gate of the fourth transistor 54, and provide an envelope reverse bias signal S3A to the gate of the first transistor 51 and the gate of the third transistor 53."

In this way, the ET switch combining the envelope tracking bias supply 4 and the switch 5 can achieve high linearity data transmission and better power handling capacity. In addition, the circuit structure of the first wideband linear stage 41 and the second wideband linear stage 42 is also used in the envelope tracking power supply 8 as the third wideband linear stage 81 to modulate the power amplifier 3 such that the linearity performance and power consumption efficiency thereof are enhanced. Moreover, the power amplifier 3 is provided with the discrete resizing driver stage 32 so that the power amplifier 3 can operate in two power modes.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A switch of an envelope tracking frontend device, comprising:
   a transmit-receive port coupled to a device;
   a transmit port coupled to a power amplifier;
   a receive port coupled to a receiver circuit;
   a first transistor including a first terminal coupled to ground, a second terminal coupled to the transmit port, and a gate coupled to an envelope tracking bias supply;
   a second transistor including a first terminal connected to the transmit port, a second terminal connected to the transmit-receive port, and a gate coupled to the envelope tracking bias supply;
   a third transistor including a first terminal connected to the transmit-receive port, a second terminal coupled to the receive port, and a gate coupled to the envelope tracking bias supply; and
   a fourth transistor including a first terminal connected to the receive port, a second terminal coupled to ground, and a gate coupled to the envelope tracking bias supply,
   wherein a first signal amplified by the power amplifier is transmitted via the transmit port to the switch as an amplified signal, which is configured to transmit the amplified signal to the device via the transmit-receive port in a first mode, and transmit a second signal from the device to the receiver circuit via the receive port in a second mode,
   wherein in the first mode, the envelope tracking bias supply is configured to provide an envelope forward bias signal to the gate of the second transistor and the gate of the fourth transistor, and provide an envelope reverse bias signal to the gate of the first transistor and the gate of the third transistor such that the amplified signal is modulated before being transmitted to the device by the switch,
   and wherein in the second mode, the envelope tracking bias supply is configured to provide the envelope forward bias signal to the gate of the first transistor and the gate of the third transistor, and provide the envelope reverse bias signal to the gate of the second transistor and the gate of the fourth transistor such that the second signal is modulated before being transmitted to the receiver circuit by the switch.

2. The switch according to claim 1, wherein the envelope tracking bias supply includes a first wideband linear stage and a second wideband linear stage, in which the first wideband linear stage is configured to amplify a received positive amplitude envelope signal and provide an amplified positive amplitude envelope signal to the switch as the envelope forward bias signal, and the second wideband linear stage is configured to amplify a received negative amplitude envelope signal and provide an amplified negative amplitude envelope signal to the switch as the envelope reverse bias signal, wherein positive amplitude envelope signal and the negative amplitude envelope signal are envelope signals of the first signal.

3. The switch according to claim 2, wherein the first wideband linear stage and the second wideband linear stage each include:
   an input section, wherein the input section includes a bias-current generating transistor and two pairs of input transistors in parallel connection with each other, to which a positive input node and a negative input node are connected;
   an amplification section, wherein the amplification section includes a plurality of amplification transistors arranged in a plurality of stages, in which at least two pairs of amplification transistors are arranged in a lowermost stage and in parallel connection with each other, and at least one pair of amplification transistors is arranged in each of the other stages of the plurality of stages, and wherein an outer pair of input transistors of the input section is in cascode connection with an outermost pair of amplification transistors arranged in the lowermost stage, and an inner pair of input transistors of the input section is in cross-cascode connection with one pair of amplification transistors in an uppermost stage such that a bias current flowing through a left transistor of the inner pair of input transistors passes through a right transistor of the outermost pair of amplification transistors in the lowermost stage before leaving the amplification section, and another bias current flowing through a right transistor of the inner pair of input transistors passes through a left transistor of the outermost pair of amplification transistors in the lowermost stage before leaving the amplification section; and an output section connected to the amplification section, wherein the output section includes at least one pair of output transistors, to which an output node is connected.

4. The switch according to claim 2, wherein the first wideband linear stage and the second wideband linear stage each include:

an input section, wherein the input section includes a bias-current generating transistor and two pairs of input transistors in parallel connection with each other, to which a positive input node and a negative input node are connected;

an amplification section, wherein the amplification section includes at least two pairs of amplification transistors in parallel connection with each other, and wherein an outer pair of input transistors of the input section is in cascode connection with an outermost pair of amplification transistors, and an inner pair of input transistors of the input section is in cross-cascode connection with one pair of amplification transistors other than the outermost pair of amplification transistors such that a bias current flowing through a left transistor of the inner pair of input transistors passes through a right transistor of the outermost pair of amplification transistors before leaving the amplification section, and another bias current flowing through a right transistor of the inner pair of input transistors passes through a left transistor of the outermost pair of amplification transistors before leaving the amplification section; and an output section connected to the amplification section, wherein the output section includes at least one pair of output transistors, to which an output node is connected.

5. The switch according to claim 2, wherein the first signal is a carrier aggregation signal.

6. The switch according to claim 1, wherein the first transistor, the second transistor, the third transistor and the fourth transistor are floating gate nMOS transistors, and the body of the first transistor, the body of the second transistor, the body of the third transistor, and the body of the fourth transistor are respectively coupled to ground, and wherein the envelope tracking bias supply further provides the envelope reverse bias signal to the body of the first transistor, the body of the second transistor, the body of the third transistor and the body of the fourth transistor.

7. An envelope tracking frontend device, comprising:

a power amplifier coupled to a signal generator and configured to receive and amplify a first signal therefrom and provide an amplified signal;

a switch coupled to a device and a receiver circuit, and configured to transmit the amplified signal to the device in a first mode, and transmit a second signal from the device to the receiver circuit in a second mode; and an envelope tracking module including an envelope tracking bias supply coupled between the signal generator and the switch, wherein the switch includes:

a transmit-receive port coupled to the device;

a transmit port coupled to the power amplifier;

a receive port coupled to the receiver circuit;

a first transistor including a first terminal coupled to ground, a second terminal coupled to the transmit port, and a gate coupled to the envelope tracking bias supply;

a second transistor including a first terminal connected to the transmit port, a second terminal connected to the transmit-receive port, and a gate coupled to the envelope tracking bias supply;

a third transistor including a first terminal connected to the transmit-receive port, a second terminal coupled to the receive port, and a gate coupled to the envelope tracking bias supply; and a fourth transistor including a first terminal connected to the receive port, a second terminal coupled to ground, and a gate coupled to the envelope tracking bias supply, wherein in the first mode, the envelope tracking bias supply is configured to provide an envelope forward bias signal to the gate of the second transistor and the gate of the fourth transistor, and provide an envelope reverse bias signal to the gate of the first transistor and the gate of the third transistor such that the amplified signal is modulated before being transmitted to the device by the switch, and wherein in the second mode, the envelope tracking bias supply is configured to provide the envelope forward bias signal to the gate of the first transistor and the gate of the third transistor, and provide the envelope reverse bias signal to the gate of the second transistor and the gate of the fourth transistor such that the second signal is modulated before being transmitted to the receiver circuit by the switch.

8. The envelope tracking frontend device according to claim 7, wherein the envelope tracking bias supply includes a first wideband linear stage and a second wideband linear stage, in which the first wideband linear stage is configured to amplify a received positive amplitude envelope signal and provide an amplified positive amplitude envelope signal to the switch as the envelope forward bias signal, and the second wideband linear stage is configured to amplify a received negative amplitude envelope signal and provide an amplified negative amplitude envelope signal to the switch as the envelope reverse bias signal, wherein positive amplitude envelope signal and the negative amplitude envelope signal are envelope signals of the first signal.

9. The envelope tracking frontend module according to claim 8, wherein the first wideband linear stage and the second wideband linear stage each include:

an input section, wherein the input section includes a bias-current generating transistor and two pairs of input transistors in parallel connection with each other, to which a positive input node and a negative input node are connected;

an amplification section, wherein the amplification section includes a plurality of amplification transistors arranged in a plurality of stages, in which at least two pairs of amplification transistors are arranged in a lowermost stage and in parallel connection with each other, and at least one pair of amplification transistors is arranged in each of the other stages of the plurality of stages, and wherein an outer pair of input transistors of the input section is in cascode connection with an outermost pair of amplification transistors arranged in the lowermost stage, and an inner pair of input transistors of the input section is in cross-cascode connection with one pair of amplification transistors in an uppermost stage such that a bias current flowing through a left transistor of the inner pair of input transistors passes through a right transistor of the outermost pair of amplification transistors in the lowermost stage before leaving the amplification section, and another bias current flowing through a right transistor of the inner pair of input transistors passes through a left transistor of the outermost pair of amplification transistors in the lowermost stage before leaving the amplification section; and an output section connected to the amplification section, wherein the output section includes at least one pair of output transistors, to which an output node is connected.

10. The envelope tracking frontend module according to claim 8, wherein the first wideband linear stage and the second wideband linear stage each include:

an input section, wherein the input section includes a bias-current generating transistor and two pairs of input transistors in parallel connection with each other, to which a positive input node and a negative input node are connected;

an amplification section, wherein the amplification section includes at least two pairs of amplification transistors in parallel connection with each other, and wherein an outer pair of input transistors of the input section is in cascode connection with an outermost pair of amplification transistors, and an inner pair of input transistors of the input section is in cross-cascode connection with one pair of amplification transistors other than the outermost pair of amplification transistors such that a bias current flowing through a left transistor of the inner pair of input transistors passes through a right transistor of the outermost pair of amplification transistors before leaving the amplification section, and another bias current flowing through a right transistor of the inner pair of input transistors passes through a left transistor of the outermost pair of amplification transistors before leaving the amplification section; and an output section connected to the amplification section, wherein the output section includes at least one pair of output transistors, to which an output node is connected.

11. The envelope tracking frontend module according to claim 7, wherein the envelope tracking module further includes an envelope tracking power supply coupled between the signal generator and the power amplifier, the envelope tracking power supply including:

a third wideband linear stage configured to receive and amplify an envelope power supply signal from the signal generator and provide an amplified envelope power supply signal to the power amplifier;

a hysteretic comparator coupled to the third wideband linear stage;

an anti-shoot-through circuit coupled to the hysteretic comparator; and a switching stage coupled between the anti-shoot-through circuit and the power amplifier, in which the hysteretic comparator, the anti-shoot-through circuit and the switching stage are coordinated to provide an envelope power to the power amplifier, wherein the third wideband linear stage includes:

an input section, wherein the input section includes a bias-current generating transistor and two pairs of input transistors in parallel connection with each other, to which a positive input node and a negative input node are connected;

an amplification section, wherein the amplification section includes a plurality of amplification transistors arranged in a plurality of stages, in which at least two pairs of amplification transistors are arranged in a lowermost stage and in parallel connection with each other, and at least one pair of amplification transistors is arranged in the other stages of the plurality of stages, and wherein an outer pair of input transistors of the input section is in cascode connection with an outermost pair of amplification transistors arranged in the lowermost stage, and an inner pair of input transistors of the input section is in cross-cascode connection with one pair of amplification transistors in an uppermost stage such that a bias current flowing through a left transistor of the inner pair of input transistors passes through a right transistor of the outermost pair of amplification transistors in the lowermost stage before leaving the amplification section, and another bias current flowing through a right transistor of the inner pair of input transistors passes through a left transistor of the outermost pair of amplification transistors in the lowermost stage before leaving the amplification section; and an output section connected to the amplification section, wherein the output section includes at least one pair of output transistors, to which an output node is connected.

12. The envelope tracking frontend module according to claim 7, wherein the envelope tracking module further includes an envelope tracking power supply coupled between the signal generator and the power amplifier, the envelope tracking power supply including:

a third wideband linear stage configured to receive and amplify an envelope power supply signal from the signal generator and provide an amplified envelope power supply signal to the power amplifier;

a hysteretic comparator coupled to the third wideband linear stage;

an anti-shoot-through circuit coupled to the hysteretic comparator; and a switching stage coupled between the anti-shoot-through circuit and the power amplifier, in which the hysteretic comparator, the anti-shoot-through circuit and the switching stage are coordinated to provide an envelope power to the power amplifier, wherein the third wideband linear stage includes:

an input section, wherein the input section includes a bias-current generating transistor and two pairs of input transistors in parallel connection with each other, to which a positive input node and a negative input node are connected;

an amplification section, wherein the amplification section includes at least two pairs of amplification transistors in parallel connection with each other, and wherein an outer pair of input transistors of the input section is in cascode connection with an outermost pair of amplification transistors, and an inner pair of input transistors of the input section is in cross-cascode connection with one pair of amplification transistors other than the outermost pair of amplification transistors such that a bias current flowing through a left transistor of the inner pair of input transistors passes through a right transistor of the outermost pair of amplification transistors before leaving the amplification section, and another bias current flowing through a right transistor of the inner pair of input transistors passes through a left transistor of the outermost pair of amplification transistors before leaving the amplification section; and an output section connected to the amplification section, wherein the output section includes at least one pair of output transistors, to which an output node is connected.

13. The envelope tracking frontend device according to claim 12, wherein the power amplifier includes:
   a driver stage;
   a power stage;
   a first matching circuit coupled between the signal generator and the driver stage;
   a second matching circuit coupled between the driver stage and the power stage; and
   a third matching circuit coupled between the power stage and the switch,
   wherein the first signal provided by the signal generator is transmitted through the first matching circuit, the driver stage, the second matching circuit, the power stage, and the third matching circuit, and then provided via the third matching circuit as the amplified signal,
   wherein the driver stage and the power stage are respectively configured to receive the amplified envelope power supply signal such that the first signal is modulated in the driver stage and the power stage,
   and wherein the driver stage includes a plurality pairs of driver transistors arranged in a discrete-resizing structure, in which each pair of driver transistors is in parallel connection with one another and includes two transistors having the same number of emitter, and in which each pair of driver transistors is configured to be driven independently such that the power amplifier operates in multiple modes.

14. The envelope tracking frontend device according to claim 13, wherein the power amplifier further includes three adaptive bias circuits respectively providing a bias voltage to bias the driver stage and the power stage.

15. The envelope tracking frontend device according to claim 7, wherein the power amplifier includes:
   a driver stage;
   a power stage;
   a first matching circuit coupled between the signal generator and the driver stage;
   a second matching circuit coupled between the driver stage and the power stage; and
   a third matching circuit coupled between the power stage and the switch,
   wherein the first signal provided by the signal generator is transmitted through the first matching circuit, the driver stage, the second matching circuit, the power stage, and the third matching circuit, and then provided via the third matching circuit as the amplified signal,
   and wherein the driver stage includes a plurality pairs of driver transistors arranged in a discrete-resizing structure, in which each pair of driver transistors is in parallel connection with one another and includes two transistors having the same number of emitter stripes, and in which each pair of drive transistors is configured to be driven independently such that the power amplifier operates in multiple modes.

16. The envelope tracking frontend device according to claim 7, wherein the signal generator is a carrier aggregation signal generator and the first signal is a carrier aggregation signal.

17. The envelope tracking frontend device according to claim 7, wherein a first envelope shaping device is coupled between the signal generator and the envelope tracking bias supply to provide the envelope tracking bias supply with the positive amplitude envelop signal and the negative amplitude envelop signal, and wherein a second envelope shaping device is coupled between the signal generator and the envelope tracking power supply to provide the envelope tracking power supply with the envelope power supply signal.

* * * * *